(12) United States Patent
Ohsawa

(10) Patent No.: US 12,185,542 B2
(45) Date of Patent: Dec. 31, 2024

(54) THREE-DIMENSIONAL MEMORY CONTAINING A STAIRCASE WITH DUMMY STEPS AND METHOD OF MAKING THEREOF WITH STEP LENGTH CONTROL

(71) Applicant: SANDISK TECHNOLOGIES LLC, Addison, TX (US)

(72) Inventor: Kazuto Ohsawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 536 days.

(21) Appl. No.: 17/654,465

(22) Filed: Mar. 11, 2022

(65) Prior Publication Data

US 2023/0309298 A1    Sep. 28, 2023

(51) Int. Cl.
| | | |
|---|---|---|
| H10B 43/27 | (2023.01) | |
| G11C 11/22 | (2006.01) | |
| G11C 16/04 | (2006.01) | |
| H01L 23/522 | (2006.01) | |
| H10B 41/10 | (2023.01) | |
| H10B 41/27 | (2023.01) | |
| H10B 41/35 | (2023.01) | |
| H10B 43/10 | (2023.01) | |
| H10B 43/35 | (2023.01) | |

(52) U.S. Cl.
CPC ......... *H10B 43/27* (2023.02); *G11C 16/0483* (2013.01); *H01L 23/5226* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/10; H10B 43/27; H10B 43/35; H10B 43/50; H10B 41/10; H10B 41/27; H10B 41/35; G11C 16/0483
See application file for complete search history.

(56) References Cited

U.S. PATENT DOCUMENTS

| | | |
|---|---|---|
| 8,828,884 B2 | 9/2014 | Lee et al. |
| 8,994,099 B2 | 3/2015 | Lee et al. |
| 9,412,753 B2 | 8/2016 | Izumi et al. |

(Continued)

OTHER PUBLICATIONS

Endoh, T. et al., "Novel Ultra High-Density Flash Memory with A Stacked-Surrounding Gate Transistor (S-GT) Structured Cell," IEDM Proc., pp. 33-36, (2001).

(Continued)

*Primary Examiner* — Mohsen Ahmadi
(74) *Attorney, Agent, or Firm* — THE MARBURY LAW GROUP PLLC

(57) ABSTRACT

A three-dimensional memory device includes an alternating stack of insulating layers and electrically conductive layers. Stepped surfaces including vertical sidewalls of the insulating layers are present in a staircase region. Pad stacks are located on the stepped surfaces. Each of the pad stacks includes an insulating pad having a same material composition as the insulating layers, and a dielectric material pad having a different material composition than the insulating layers and having sidewalls that are vertically coincident with sidewalls of the insulating pad. Memory stack structures extend through the alternating stack. Each of the memory stack structures includes a vertical stack of memory elements and a vertical semiconductor channel.

17 Claims, 42 Drawing Sheets

(56) References Cited

U.S. PATENT DOCUMENTS

| | | | |
|---|---|---|---|
| 9,524,901 | B2 | 12/2016 | Izumi et al. |
| 9,716,105 | B1 | 7/2017 | Tsutsumi |
| 9,905,573 | B1 | 2/2018 | Mada et al. |
| 10,224,240 | B1 | 3/2019 | Funayama et al. |
| 10,290,803 | B2 | 5/2019 | Sano et al. |
| 10,453,854 | B2 | 10/2019 | Kanno et al. |
| 10,461,163 | B2 | 10/2019 | Kanakamedala et al. |
| 10,608,010 | B2 | 3/2020 | Terasawa et al. |
| 10,629,606 | B2 | 4/2020 | Sugawara et al. |
| 10,700,089 | B1 | 6/2020 | Hojo et al. |
| 2013/0313627 | A1 | 11/2013 | Lee et al. |
| 2016/0148835 | A1* | 5/2016 | Shimabukuro ... H01L 21/76816 257/314 |
| 2016/0148946 | A1* | 5/2016 | Hironaga ............... H10B 43/27 438/586 |
| 2016/0163728 | A1* | 6/2016 | Tsutsumi ............... H10B 41/27 257/66 |
| 2016/0204122 | A1* | 7/2016 | Shoji ...................... H10B 43/50 257/314 |
| 2016/0211272 | A1* | 7/2016 | Koka ..................... H10B 43/40 |
| 2018/0061850 | A1 | 3/2018 | Mada et al. |
| 2018/0158873 | A1 | 6/2018 | Sano et al. |
| 2019/0139974 | A1 | 5/2019 | Sugawara et al. |
| 2019/0148392 | A1 | 5/2019 | Kanno et al. |
| 2019/0148506 | A1 | 5/2019 | Kanakamedala et al. |
| 2019/0280001 | A1 | 9/2019 | Terasawa et al. |
| 2021/0366920 | A1 | 11/2021 | Tokita et al. |
| 2021/0366924 | A1 | 11/2021 | Tokita et al. |
| 2022/0005818 | A1 | 1/2022 | Tanaka et al. |
| 2022/0005824 | A1 | 1/2022 | Tanaka et al. |
| 2022/0028879 | A1 | 1/2022 | Mochizuki et al. |

OTHER PUBLICATIONS

U.S. Appl. No. 17/166,357, filed Feb. 3, 2021, SanDisk Technologies LLC.
U.S. Appl. No. 17/355,883, filed Jun. 23, 2021, SanDisk Technologies LLC.
U.S. Appl. No. 17/411,689, filed Aug. 25, 2021, SanDisk Technologies LLC.
U.S. Appl. No. 17/411,726, filed Aug. 25, 2021, SanDisk Technologies LLC.
U.S. Appl. No. 17/525,233, filed Nov. 12, 2021, SanDisk Technologies LLC.

* cited by examiner

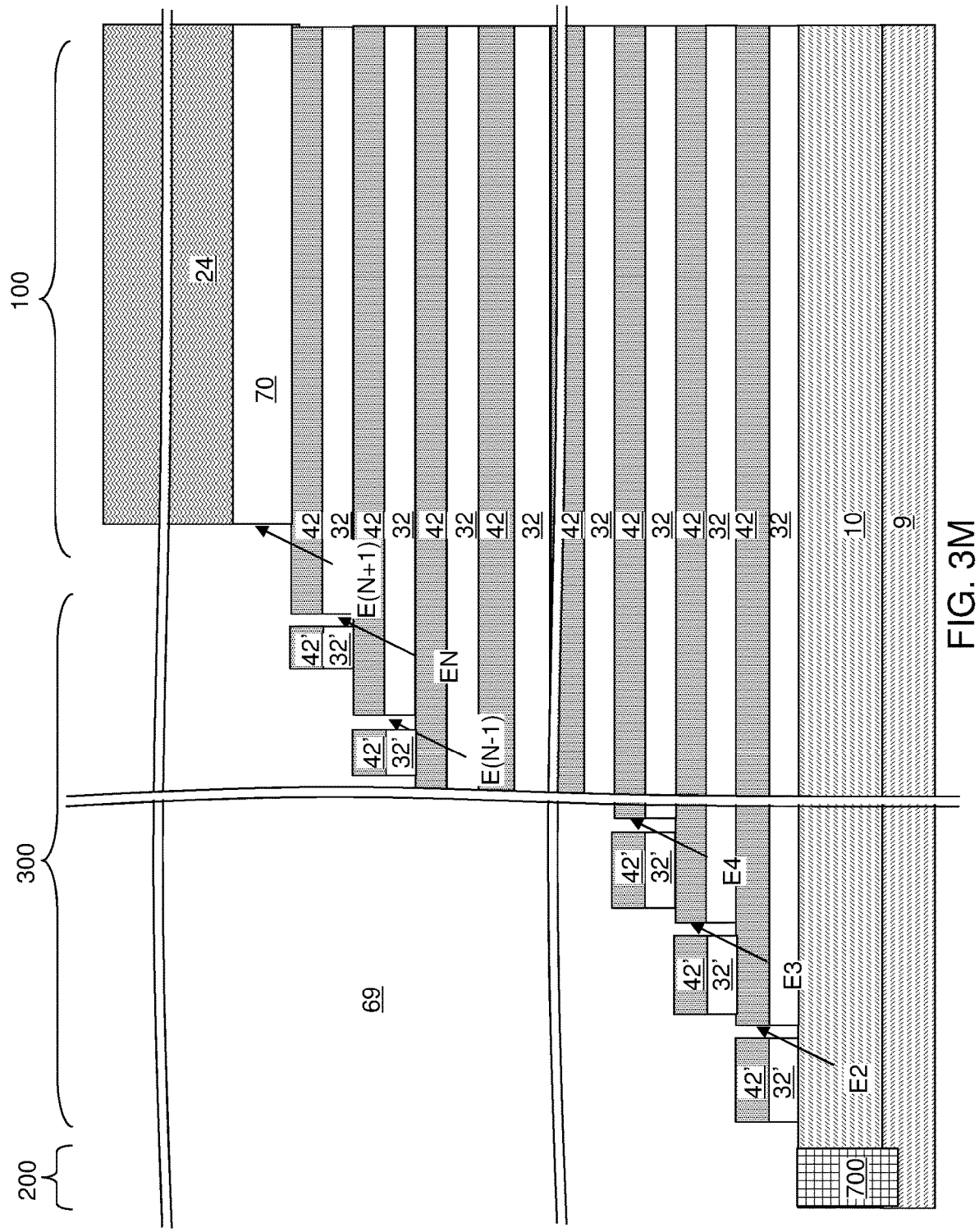

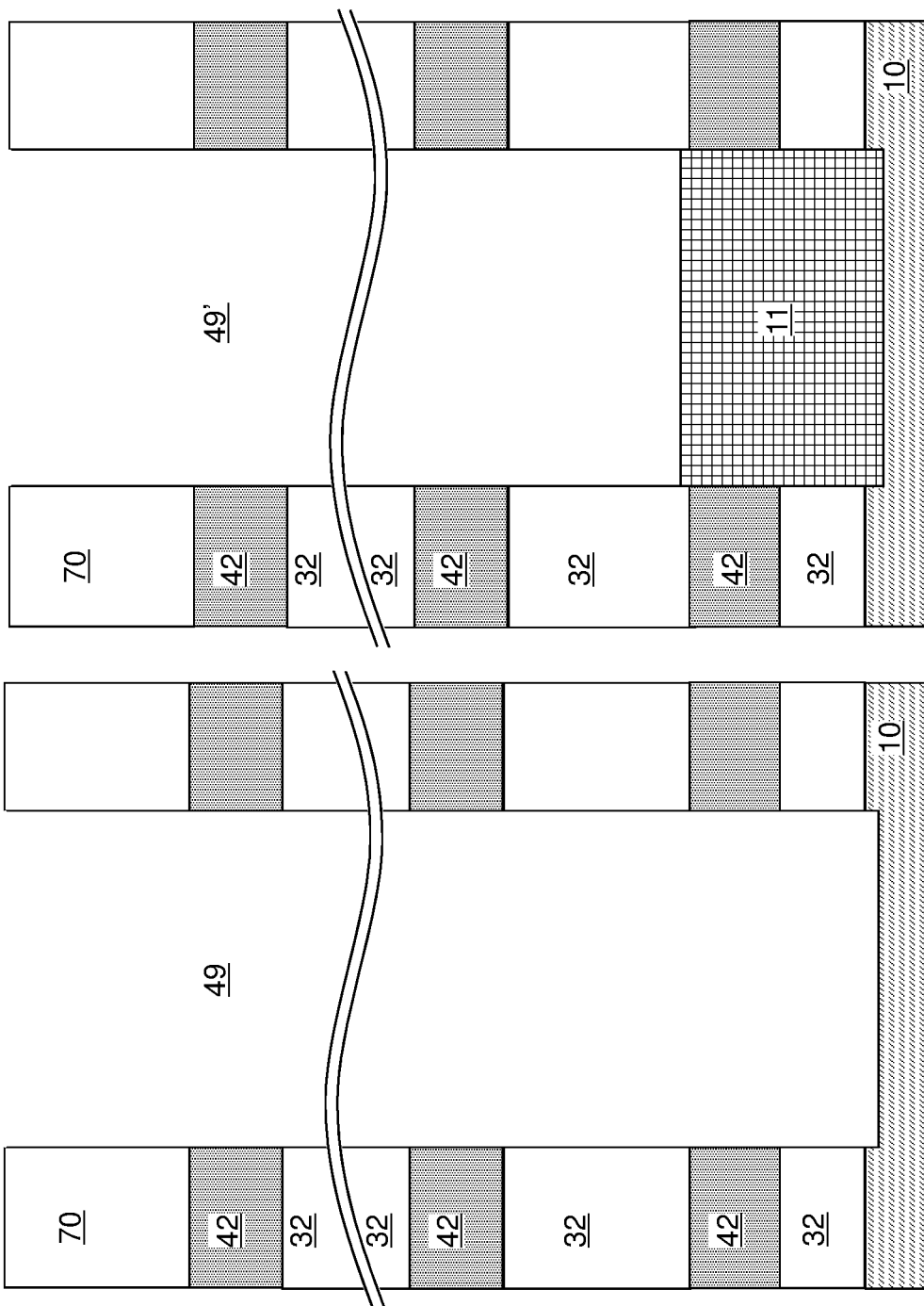

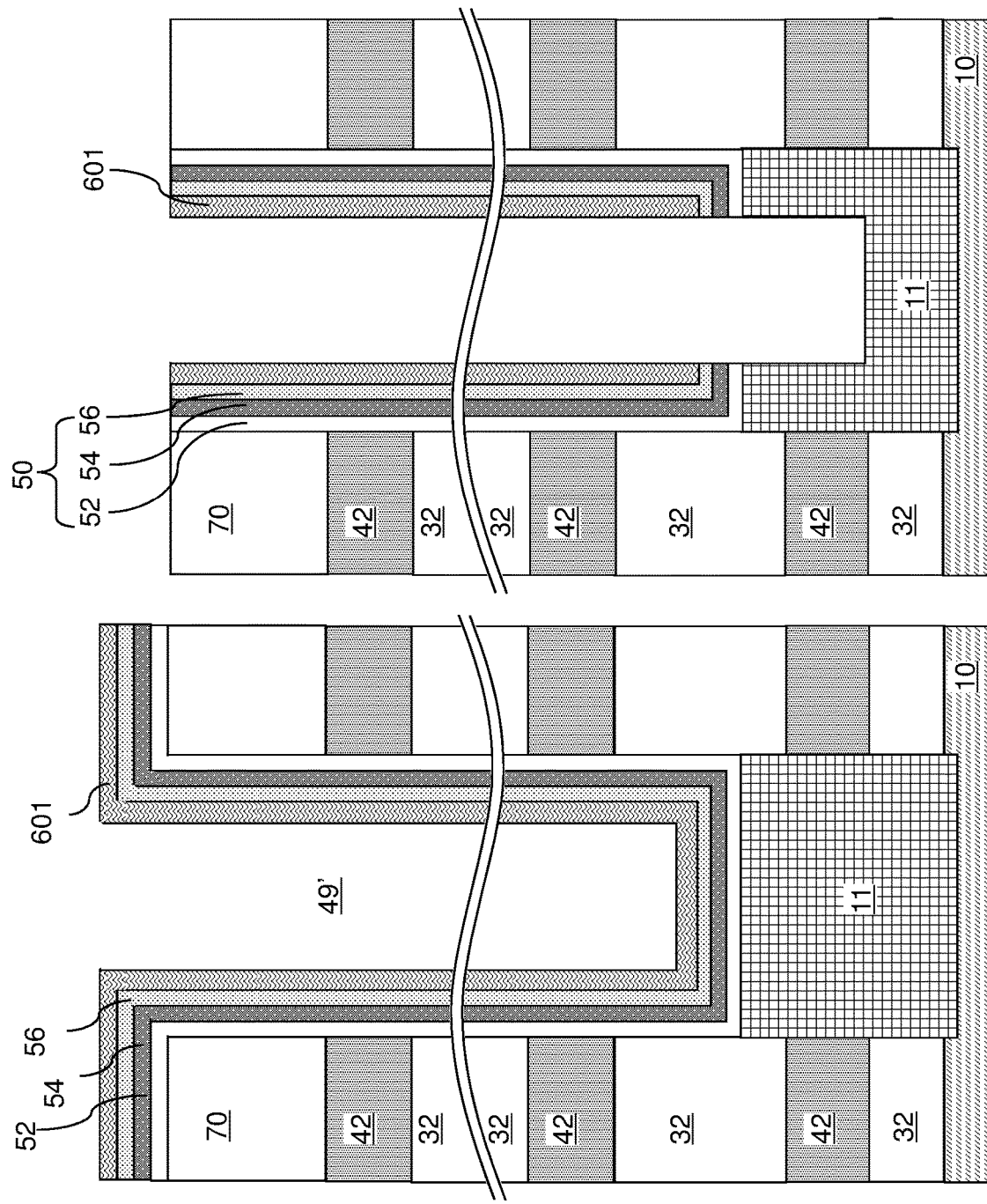

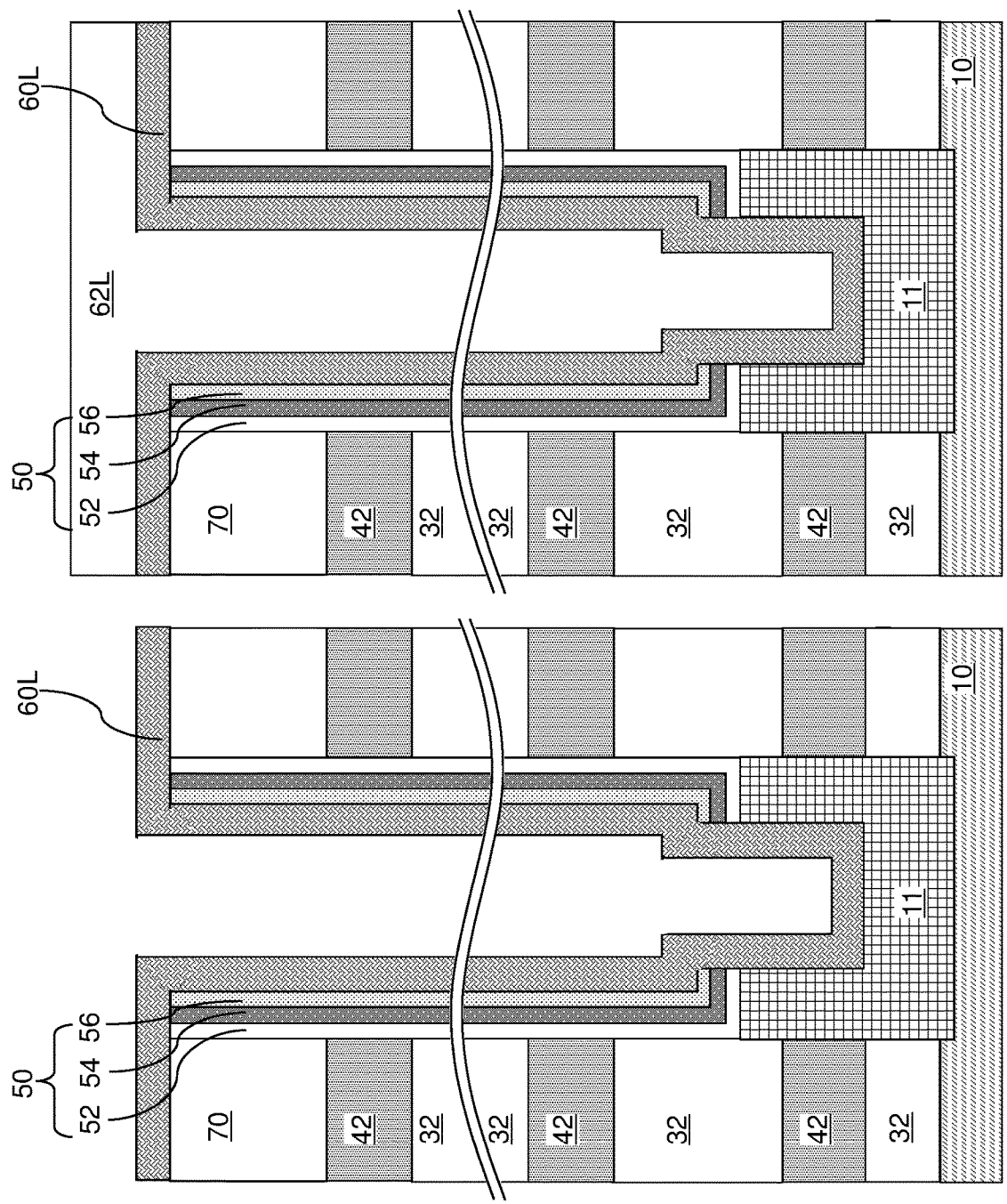

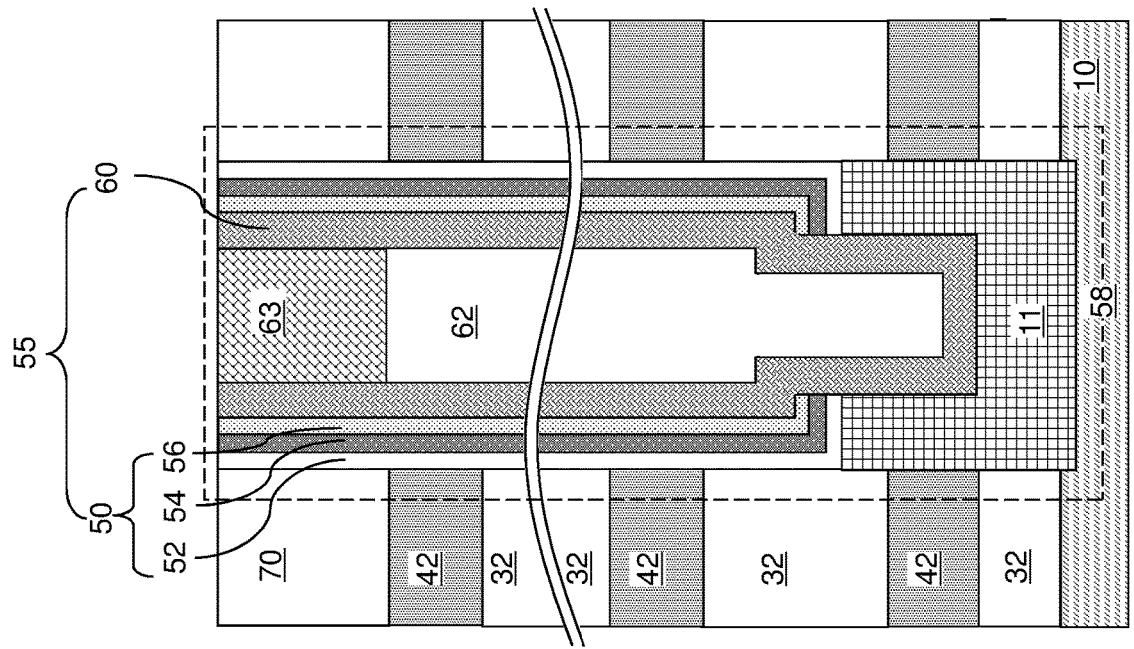
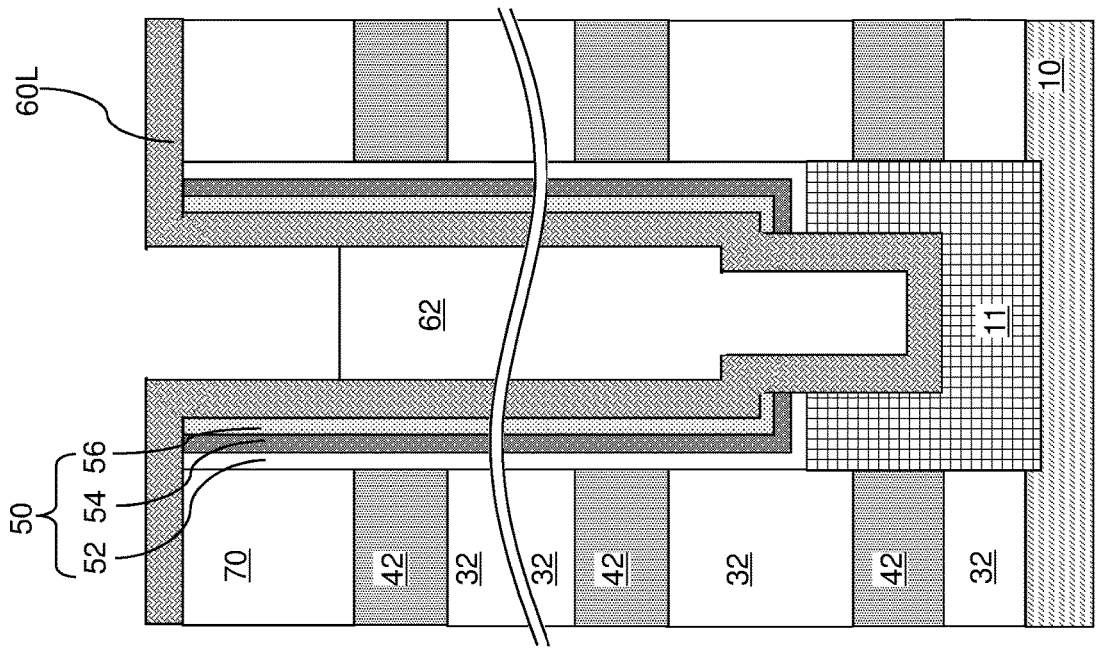

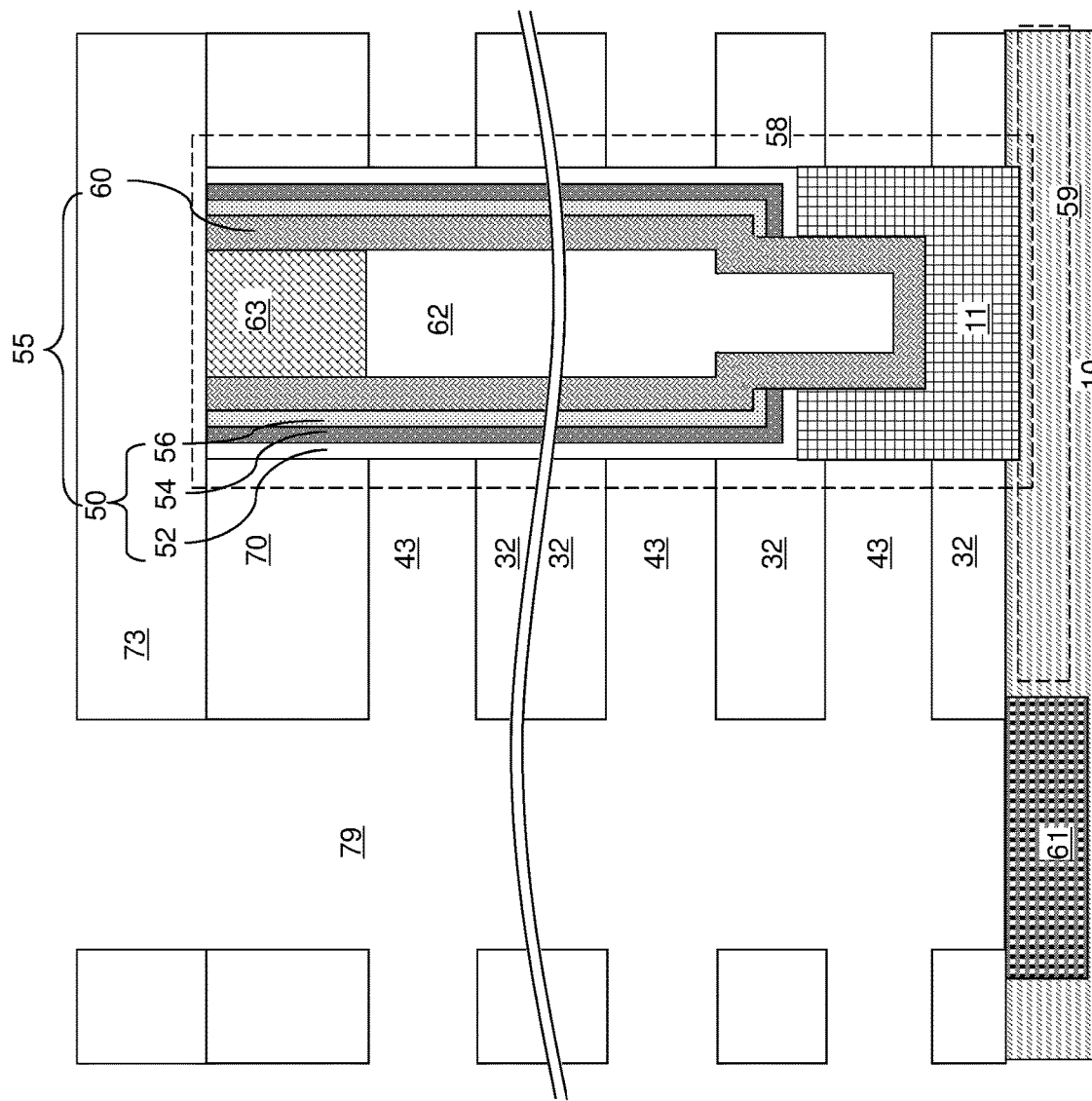

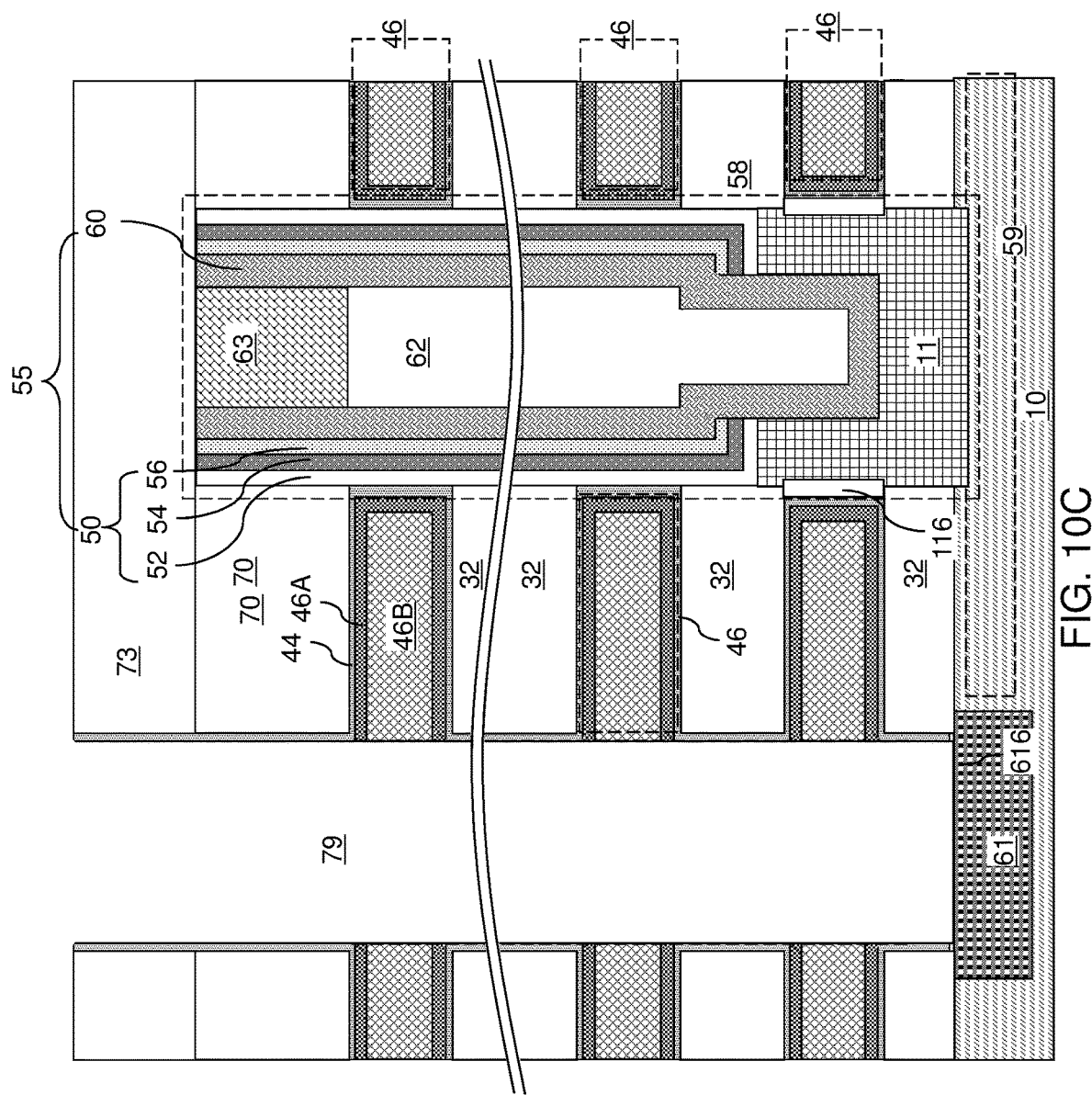

THREE-DIMENSIONAL MEMORY CONTAINING A STAIRCASE WITH DUMMY STEPS AND METHOD OF MAKING THEREOF WITH STEP LENGTH CONTROL

FIELD

The present disclosure relates generally to the field of semiconductor devices, and particularly to a three-dimensional memory device and methods of forming the same using dummy steps to provide staircase step length control.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises an alternating stack of insulating layers and electrically conductive layers, wherein stepped surfaces comprising vertical sidewalls of the insulating layers are present in a staircase region; pad stacks located on the stepped surfaces, wherein each of the pad stacks comprises an insulating pad having a same material composition as the insulating layers, and a dielectric material pad having a different material composition than the insulating layers and having sidewalls that are vertically coincident with sidewalls of the insulating pad; and memory stack structures extending through the alternating stack, wherein each of the memory stack structures comprises a vertical stack of memory elements and a vertical semiconductor channel.

According to another aspect of the present disclosure, a method of forming a three-dimensional memory device comprises forming an alternating stack of insulating layers and dielectric sacrificial material layers over a substrate; forming insulating strips over the alternating stack, wherein the insulating strips are laterally spaced apart along a first horizontal direction and laterally extend along a second horizontal direction that is perpendicular to the first horizontal direction; forming a trimmable mask material layer over the insulating strips such that an edge of the trimmable mask material layer that laterally extends along a second horizontal direction that is perpendicular to the first horizontal direction overlies one of the insulating strips; performing multiple iterations of a unit pattern transfer sequence, wherein the unit pattern transfer sequence comprises a first processing step in which unmasked portions of the alternating stack and the insulating strips are etched anisotropically by a respective anisotropic etch process, and a second processing step in which the trimmable mask layer is trimmed by a respective trimming distance, whereby stepped surfaces comprising vertical sidewalls of the insulating layers, vertical sidewalls of the dielectric sacrificial material layers, and horizontal surfaces the insulating layers or the dielectric sacrificial material layers are formed a staircase region in which lateral extents of the dielectric sacrificial material layers decrease with a vertical distance from the substrate; forming memory stack structures through the alternating stack, wherein each of the memory stack structures comprises a vertical stack of memory elements and a vertical semiconductor channel; and replacing the dielectric sacrificial material layers with electrically conductive layers.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 10C is a schematic vertical cross-sectional view of the exemplary structure along the vertical plane C-C' of FIG. 10B.

DETAILED DESCRIPTION

Figure 1:
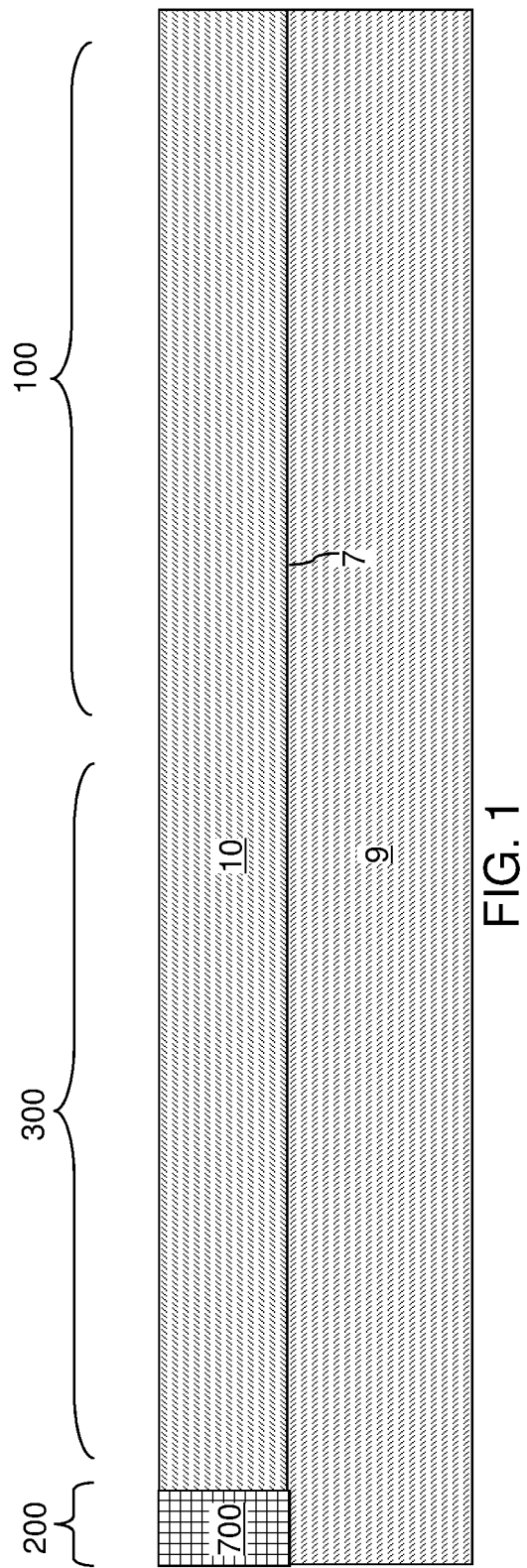
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device and methods of forming the same using dummy steps to provide staircase step length control, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{-5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^6$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. The optional semiconductor material layer 10, if present, can be formed on the top surface of the substrate semiconductor layer 9 prior to or after formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration, as will be described in more detail below with respect to FIG. 14. In another alternative embodiment, the peripheral device region 200 may be located on a separate substrate which is subsequently bonded to the memory array region 100.

Figure 2A:
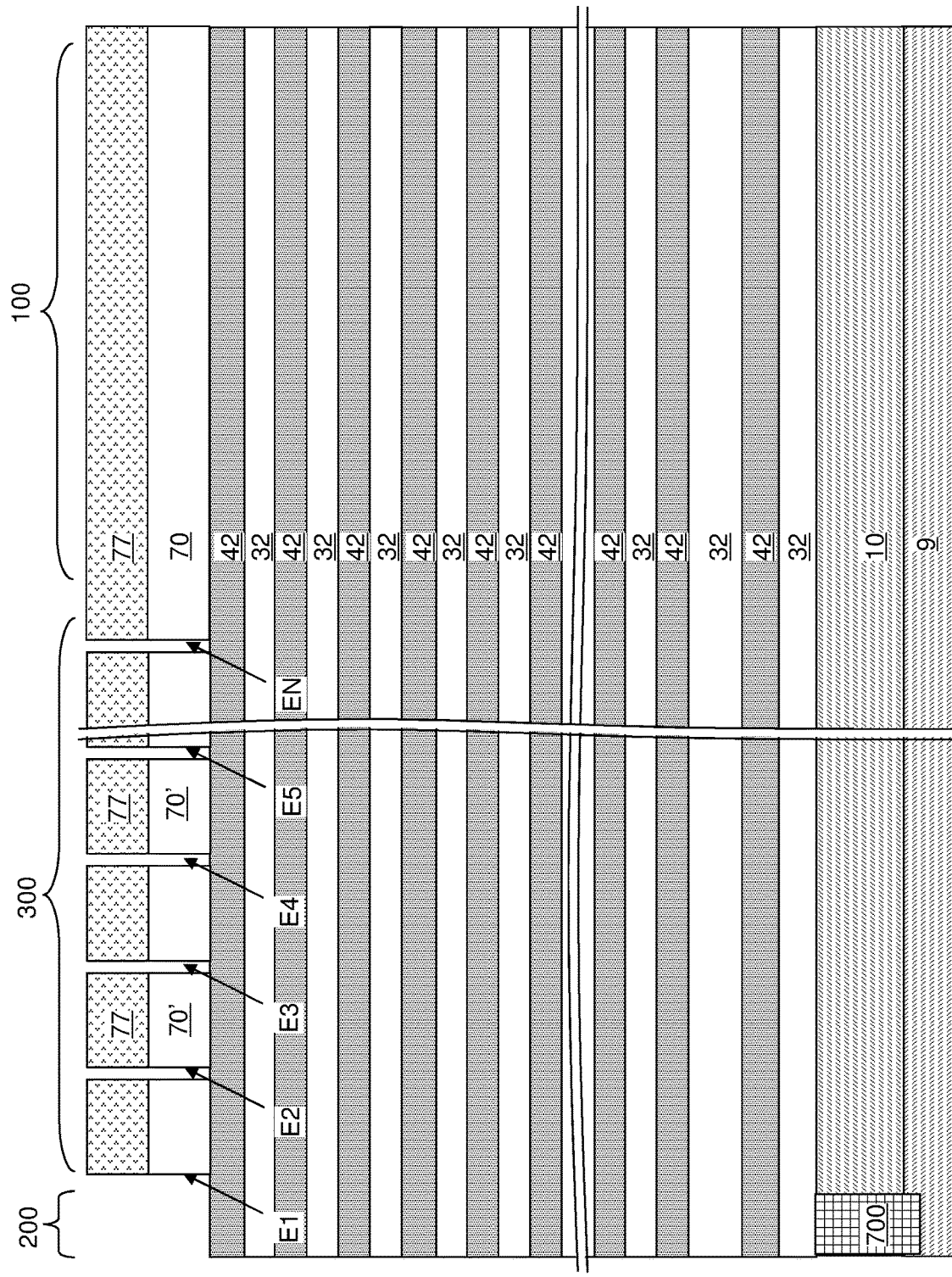
FIG. 2A is a schematic vertical cross-sectional view of the exemplary structure after formation of an alternating stack of insulating layers and sacrificial material layers and insulating strips according to an embodiment of the present disclosure.
Figure 2B:
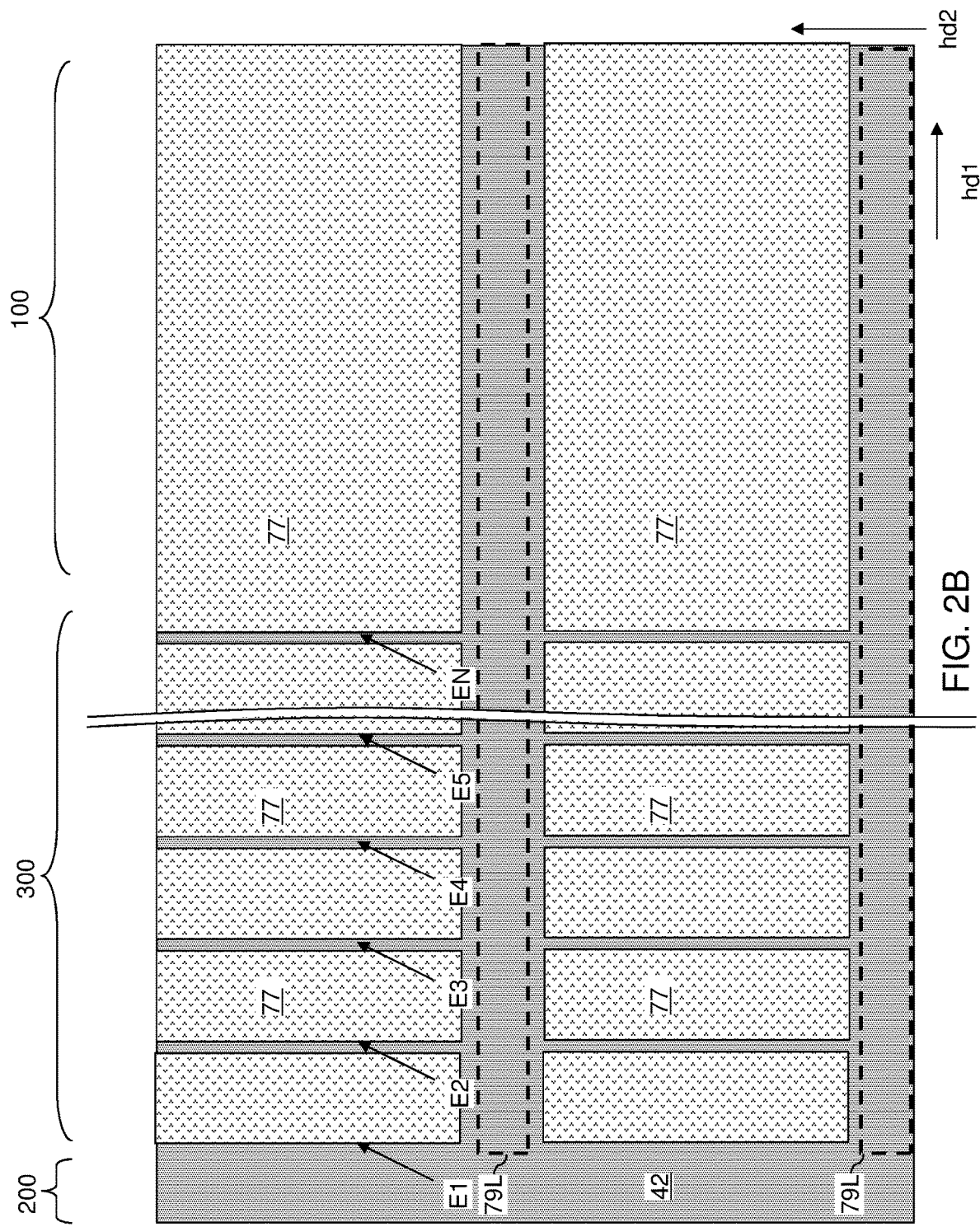
FIG. 2B is a top-down view of the exemplary structure of FIG. 2A.

Referring to FIGS. 2A and 2B, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 comprises a dielectric material. The second material of the sacrificial material layers 42 can be subsequently replaced with electrically conductive electrodes which can function, for example, as control gate electrodes of a vertical NAND device. Non-limiting examples of the second material include silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate. In one embodiment, the insulating layers 32 comprise, and/or consist essentially of, a silicon oxide material, and the sacrificial material layers 42 comprise, and/or consist essentially of, a silicon nitride material.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. The sacrificial material layers 42 are replaced with electrically conductive layers that function as gate electrodes (e.g., control gate electrodes/word lines and select gate electrodes). The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

According to an aspect of the present disclosure, an insulating material can be deposited over the alternating stack (32, 42) to form an insulating cap material layer. The insulating material may be the same as the insulating material of the insulating layers 32. For example, the insulating cap material may comprise a silicate glass material. The thickness of the insulating cap material layer may be in a range from 100% to 300% of the thickness of each insulating layer 32. Generally, the thickness of the insulating cap material layer may be selected such that the etch distance through the insulating cap material layer of each anisotropic etch step to be subsequently employed during formation of stepped surfaces is about the same as the thickness of the insulating cap material layer.

A photoresist layer 77 can be applied over the insulating cap material layer, and can be lithographically patterned to form an array of rectangular dummy step shapes within the staircase region 300. The dummy step shapes cover the areas where dummy steps will be formed. The dummy step shapes are separated along the first horizontal direction (e.g., word line direction) hd1 by line shaped spaces. The dummy step shapes are separated along the second horizontal direction (e.g., bit line direction) hd2 by rectangular shaped spaces that correspond to backside trench location areas 79L where the backside trenches 79 will be formed in a subsequent step described below with respect to FIGS. 7A and 7B. Thus, the patterned photoresist layer 77 may partly cover the staircase region 300 such that a line and space pattern of the photoresist layer 77 is present in the staircase region 300. The patterned photoresist layer 77 can cover the entire area of the memory array region 100 except for the backside trench location areas 79L. The photoresist layer 77 may be removed from the entire area of the peripheral region 200.

An anisotropic etch process can be performed to transfer the pattern in the patterned photoresist layer 77 through the insulating cap material layer. The insulating cap material layer is divided into an insulating cap layer 70 and an array of insulating strips 70'. The insulating cap layer 70 covers the alternating stack (32, 42) in the memory array region 100 except in the backside trench location areas 79L.

The insulating strips 70' function as initial dummy steps in the staircase region 300. The insulating strips 70' are located in the staircase region 300, are laterally spaced apart along the first horizontal direction hd1, and laterally extend along the second horizontal direction hd2 that is perpendicular to the first horizontal direction hd1. The insulating strips 70' are laterally spaced apart along the first horizontal direction hd1 with a uniform pitch, and each neighboring pair of insulating strips 70' may be laterally spaced apart from each other along the first horizontal direction hd1 by a uniform gap width that is in a range from 2% to 30% of the uniform pitch. Each insulating strip 70' may have a uniform width along the second horizontal direction hd2 that is in a range from 70% to 98% of the uniform pitch. The insulating strips 70 are separated along the second horizontal direction hd2 by the backside trench location areas 79L.

Each of the insulating strips 70' may have a respective pair of straight vertical edges that laterally extend along the second horizontal direction hd2. For each pair of straight vertical edges of an insulating strip 70', the straight vertical edge that is more proximal to the peripheral region 200 than the other straight vertical edge is herein referred to as a step-defining edge. In case the alternating stack (32, 42) includes N insulating layers 32 and N sacrificial material layers 42, (N−1) insulating strips 70' are formed in the exemplary structure, and N step-defining edges are provided in the exemplary structure. N may comprise any positive integer, and may range from 128 to 1024 in one embodiment. The (N−1) step-defining edges can be numbered with positive integers ranging from 1 to (N−1) in the order of proximity to the peripheral region 200. The first step-defining edge can be labeled with E1, the second step-defining edge can be labeled E2, the third step-defining edge can be labeled with E3, and so forth, and the (N−1)-th step-defining edge can be labeled with E(N−1). A straight vertical edge of the insulating cap layer 70 that is proximal to the memory array region 100 functions as an additional step-defining edge, which is herein referred to an N-th step defining edge EN. The photoresist layer 77 can be subsequently removed, for example, by ashing.

Figure 3A:
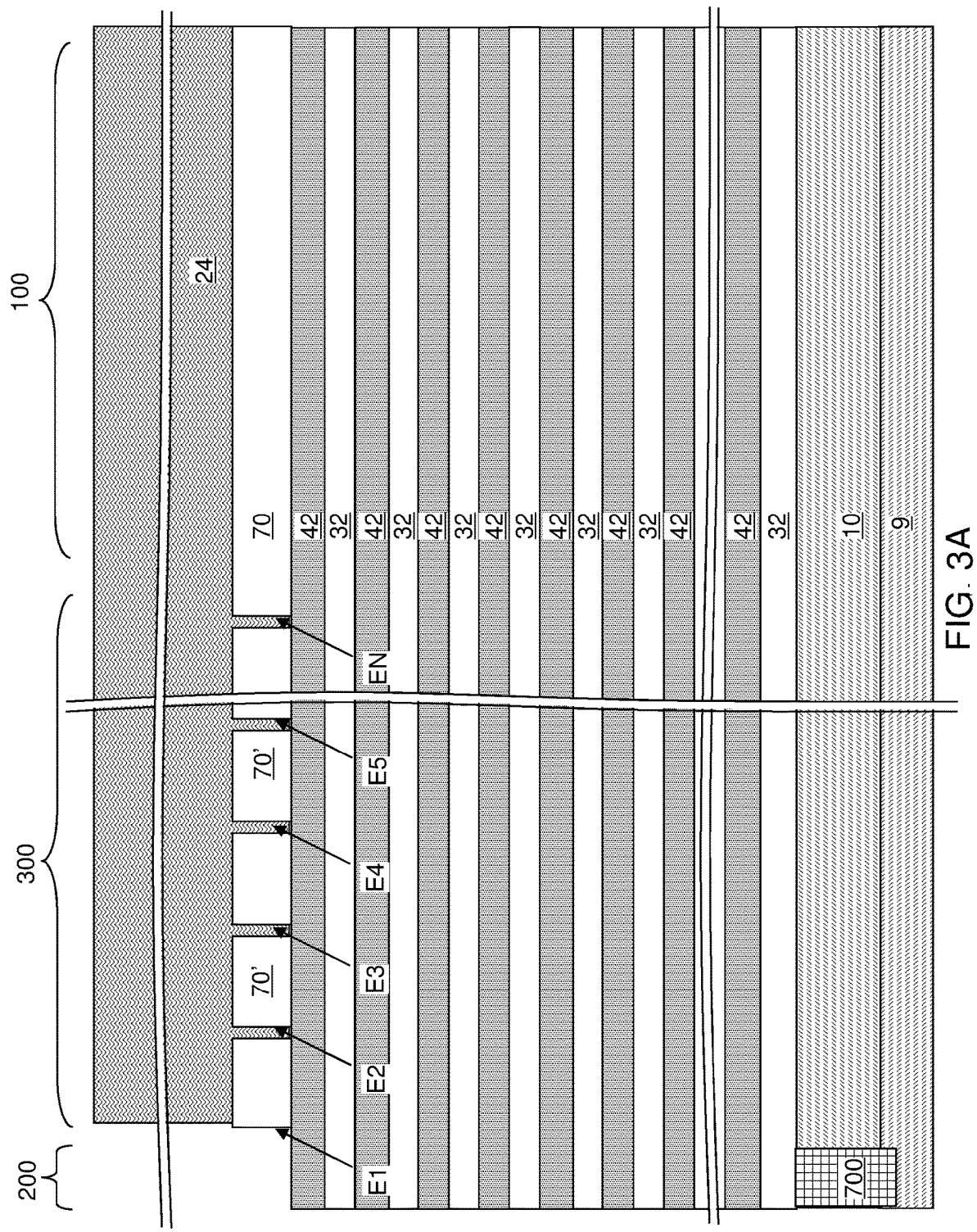
FIGS. 3A-3N are schematic sequential vertical cross-sectional views of the exemplary structure during formation of stepped surfaces and a stepped dielectric material portion according to an embodiment of the present disclosure.
Figure 3B:
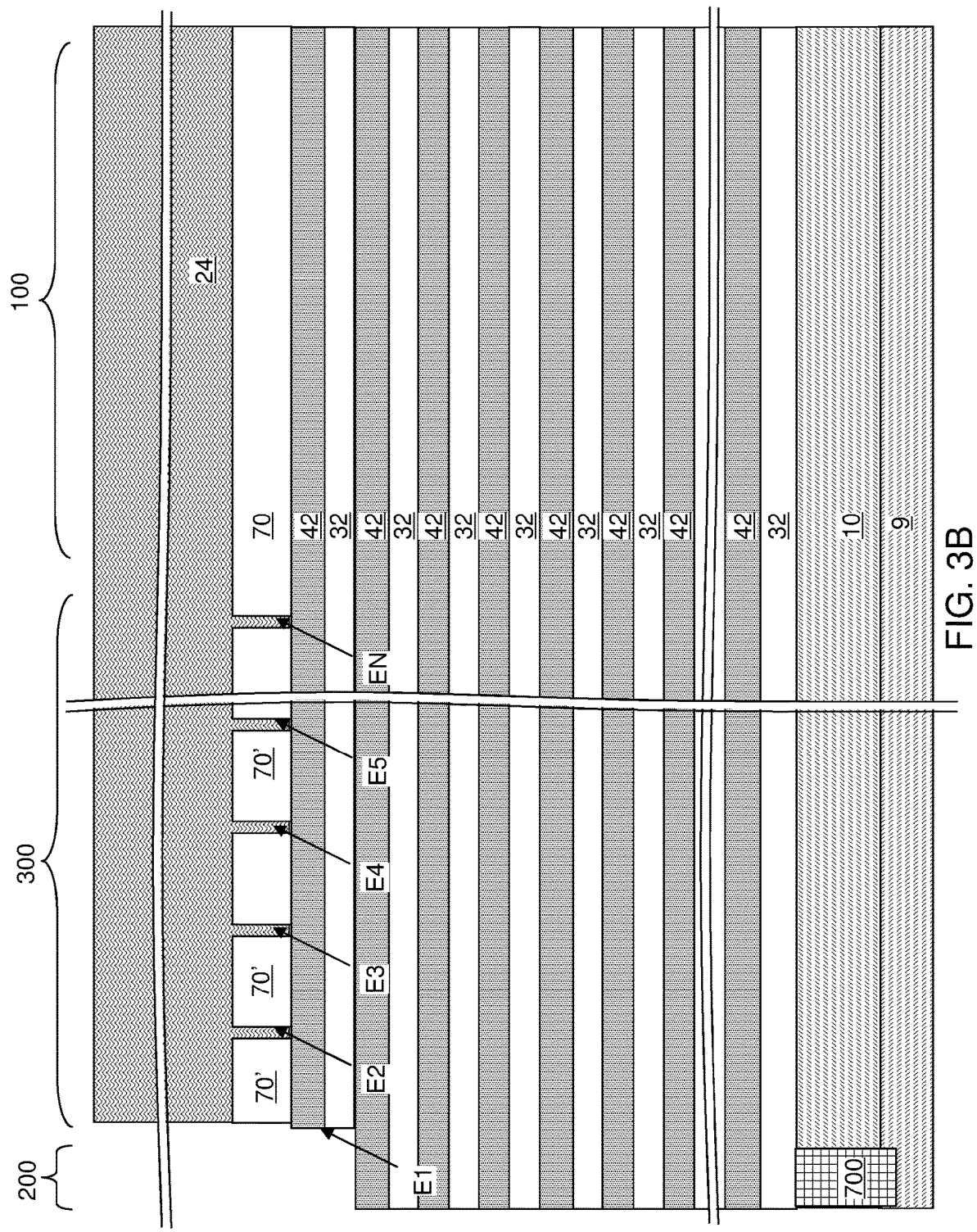
FIG. 3O is a schematic vertical cross-sectional view of another region of the exemplary structure at the processing steps of FIG. 3N according to an embodiment of the present disclosure.
Figure 3C:
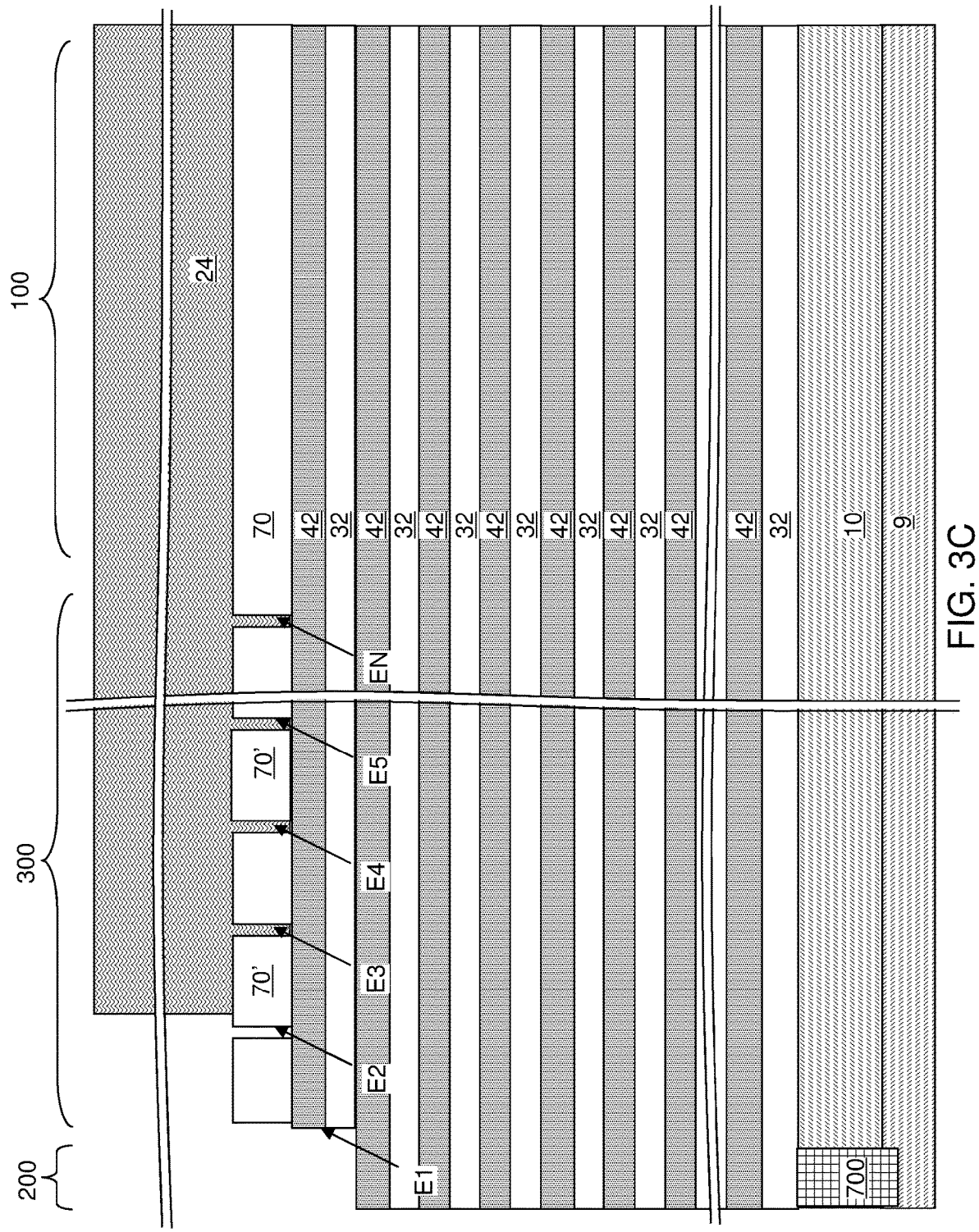
Figure 3D:
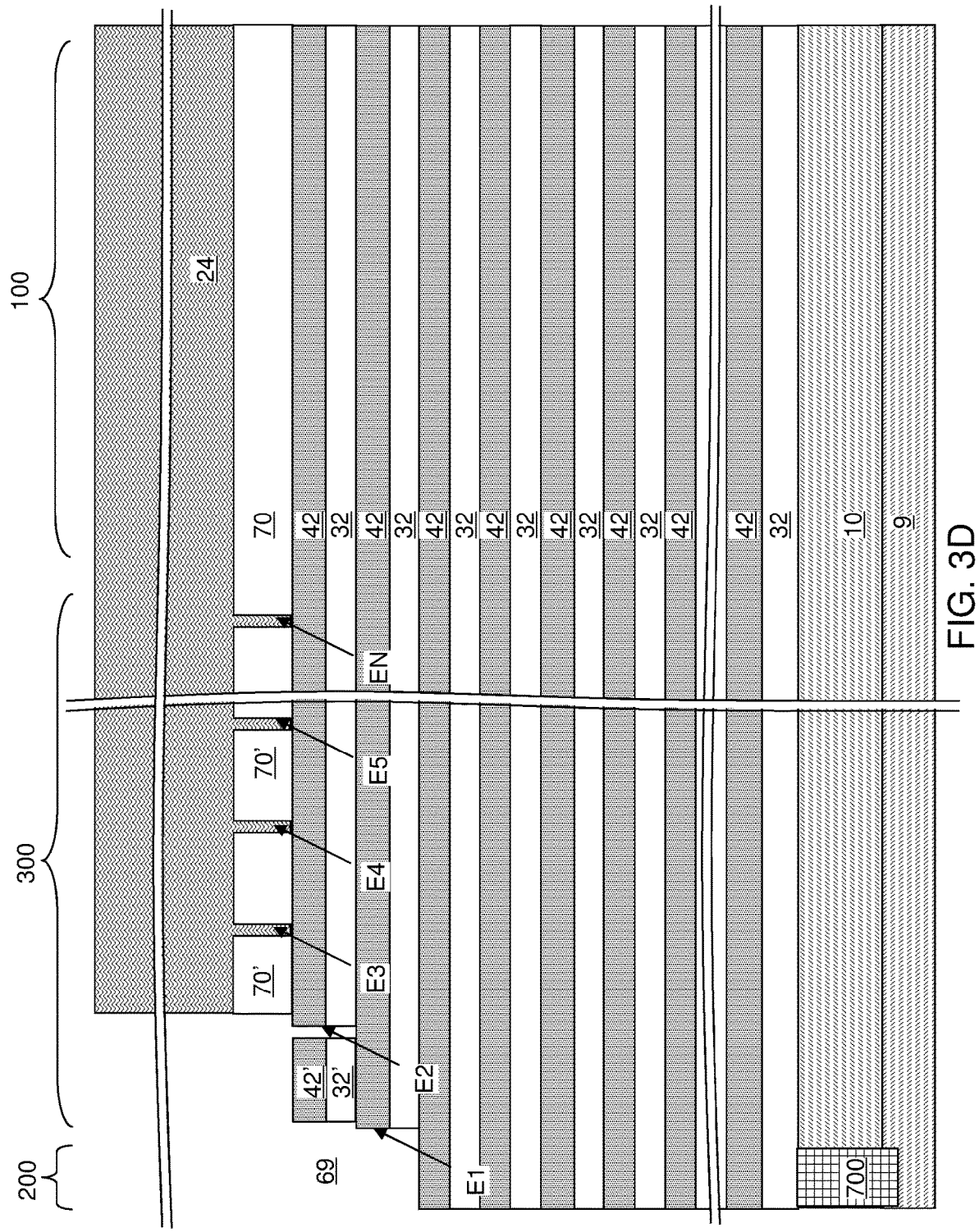
Figure 3E:
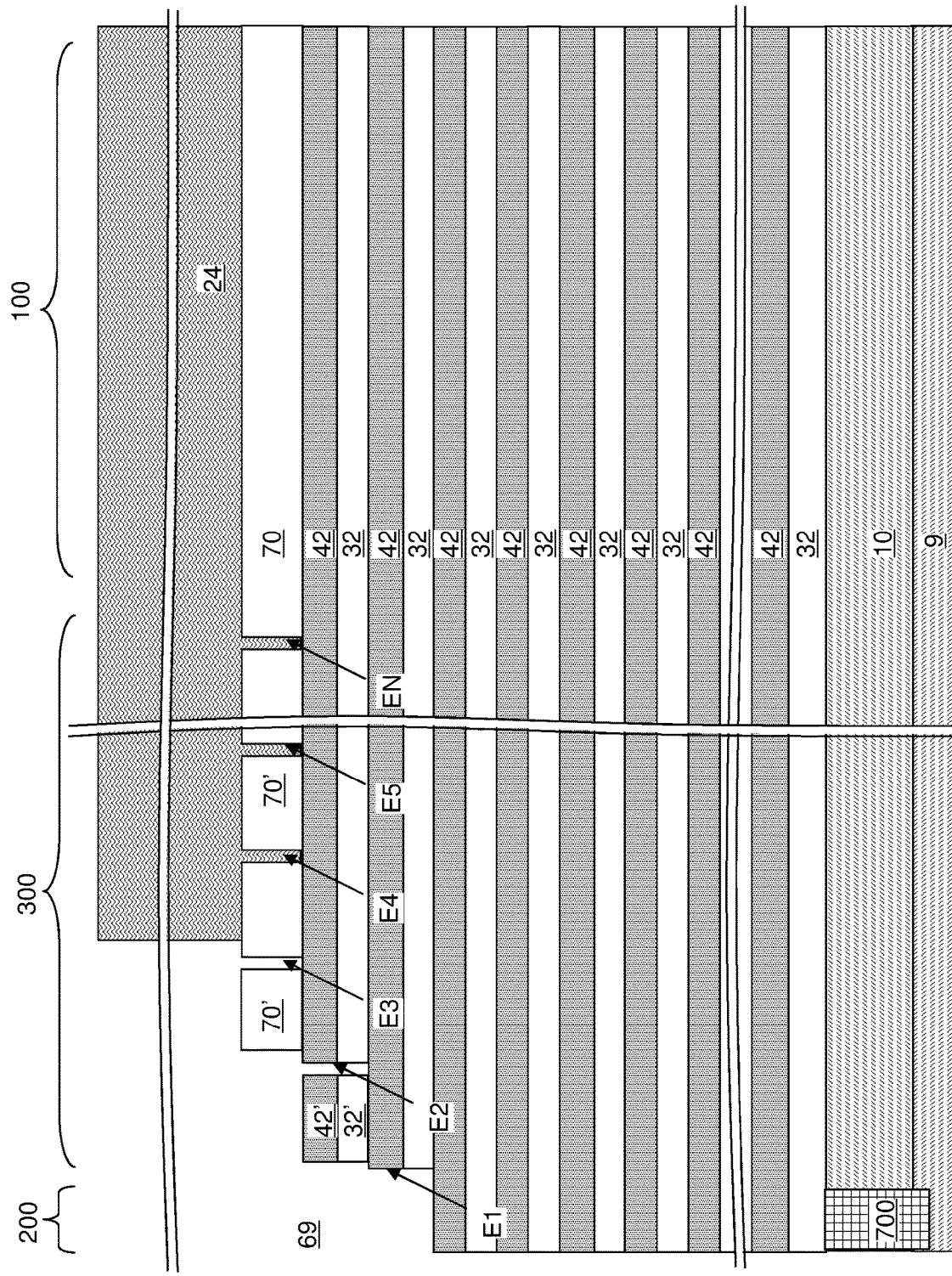
Figure 3F:
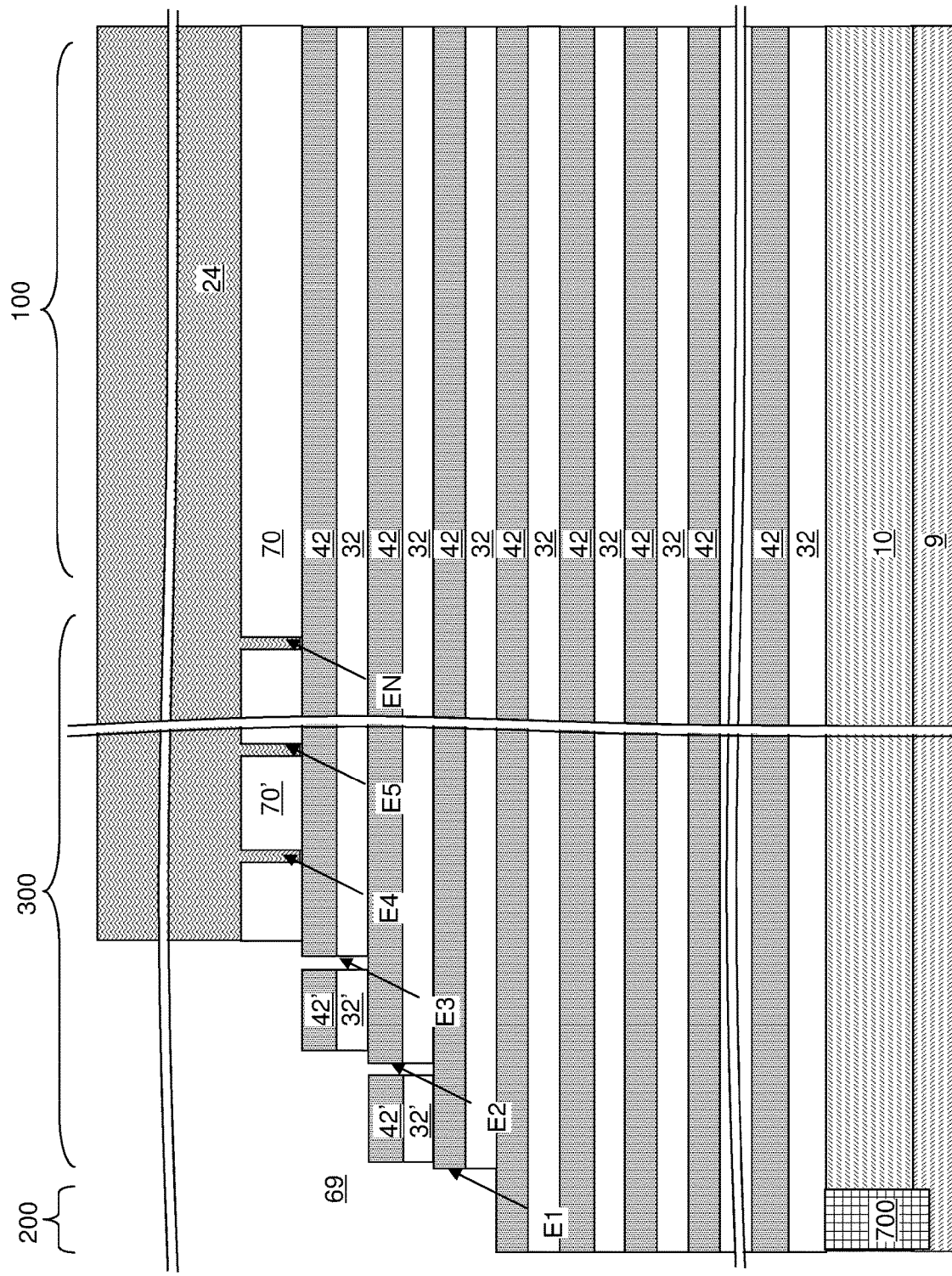
Figure 3G:
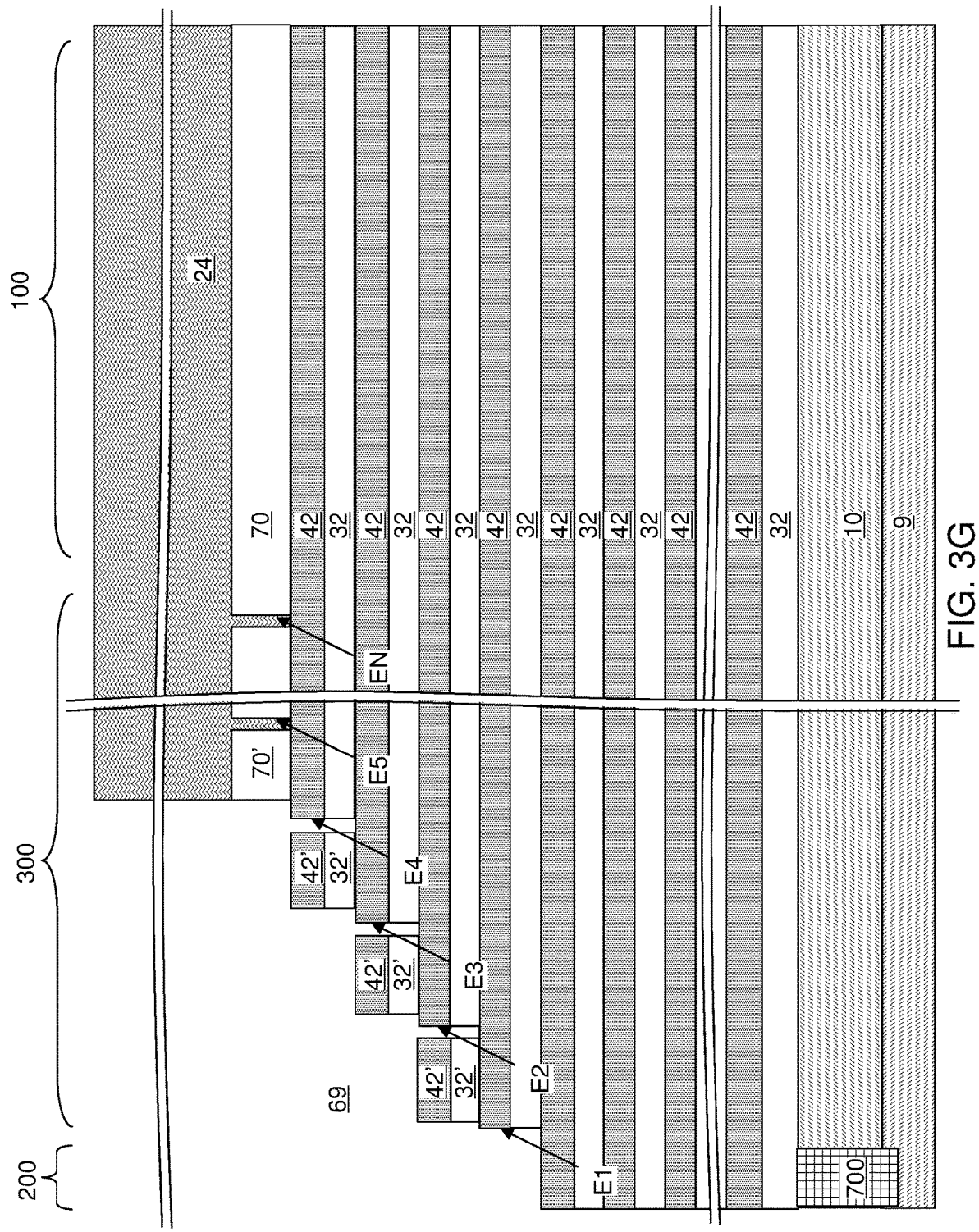
Figure 3H:
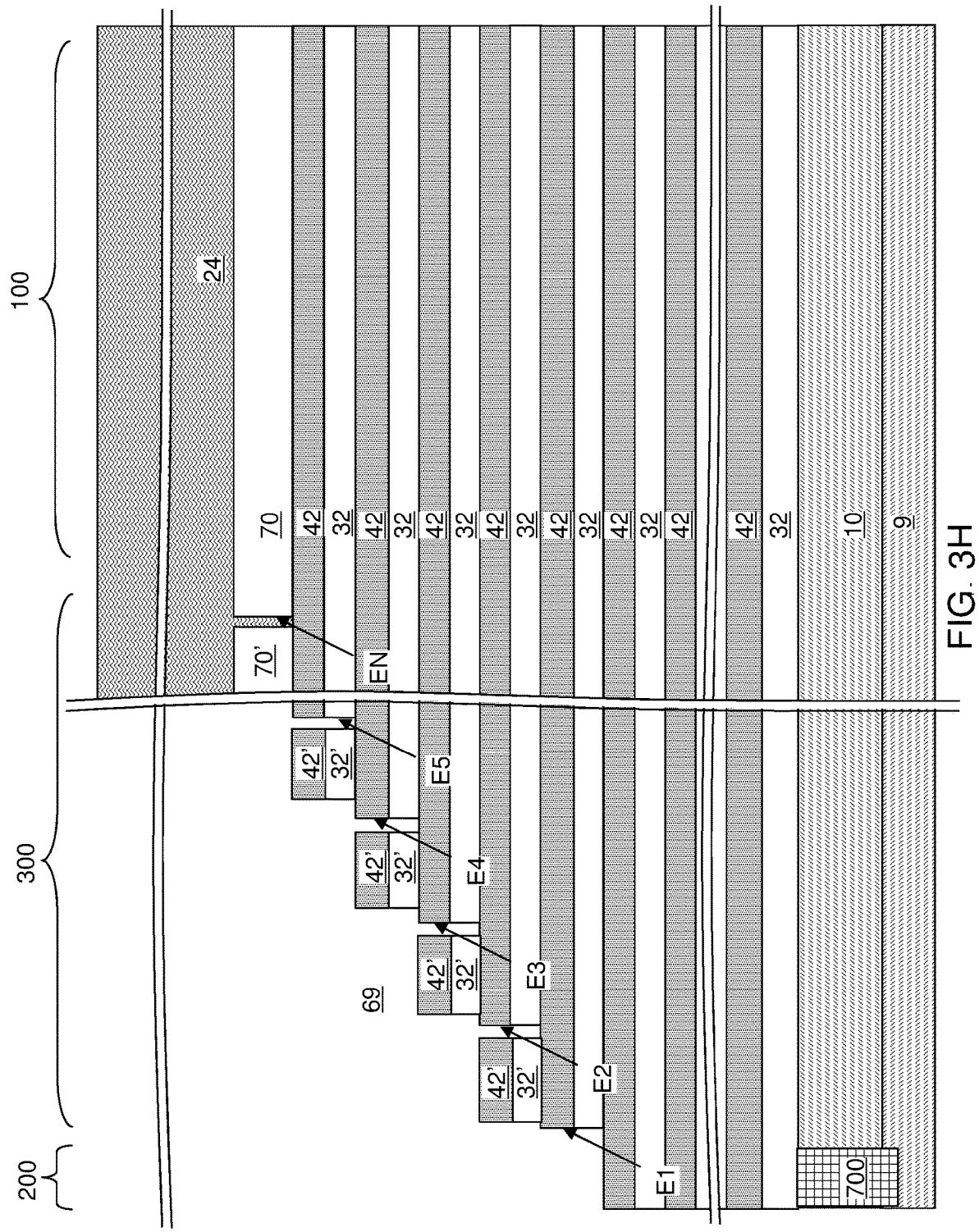
Figure 3I:
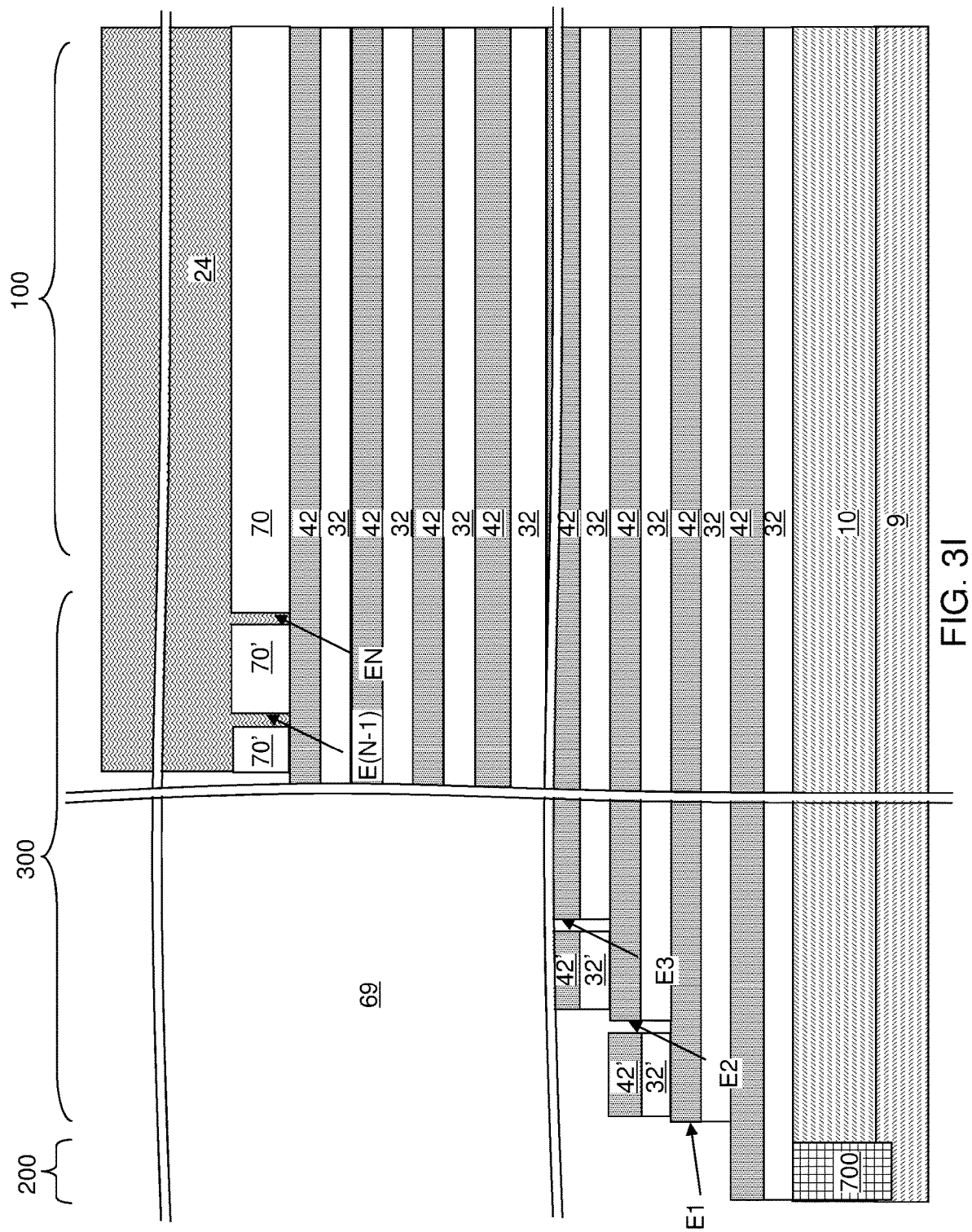
Figure 3J:
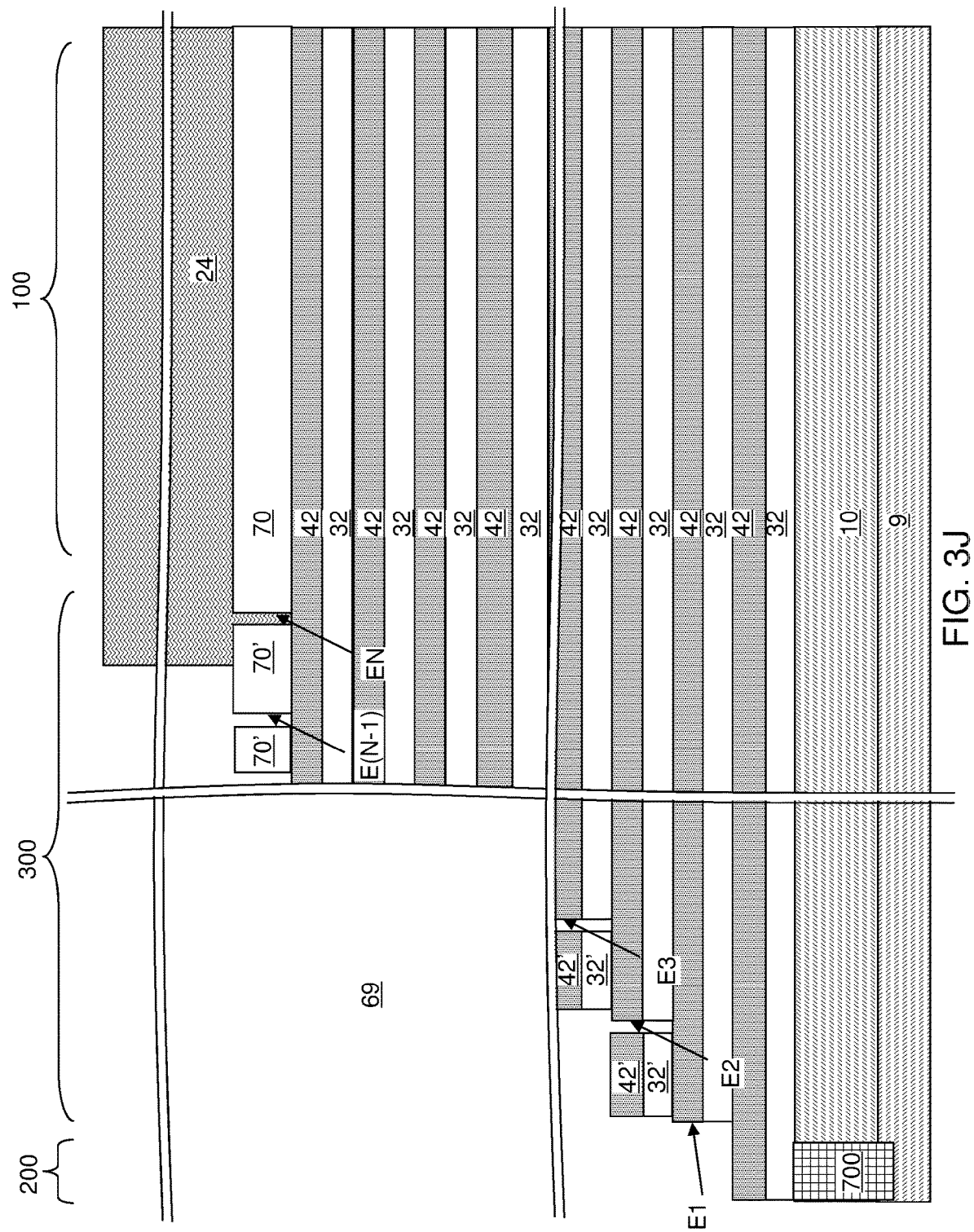
Figure 3K:
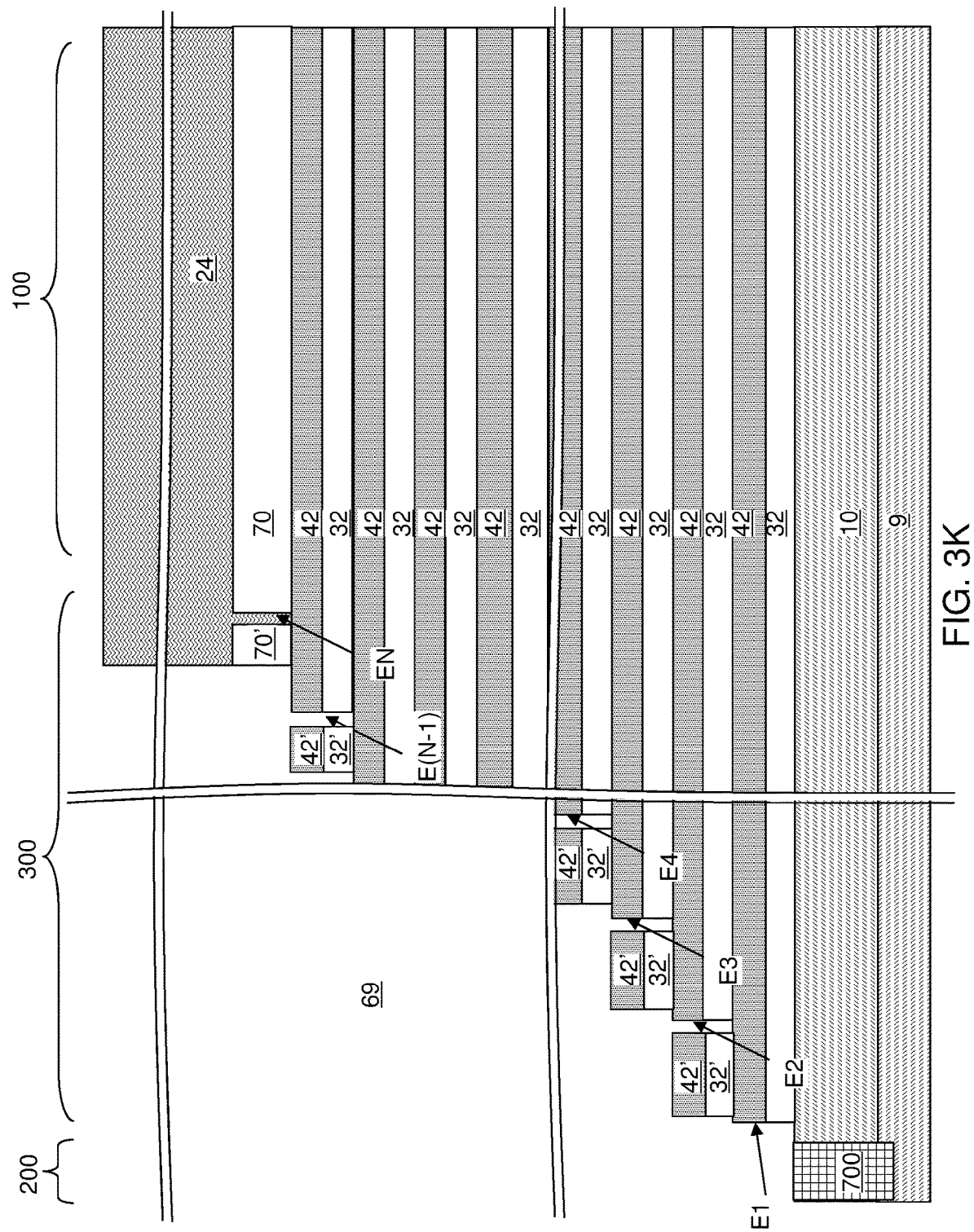
Figure 3L:
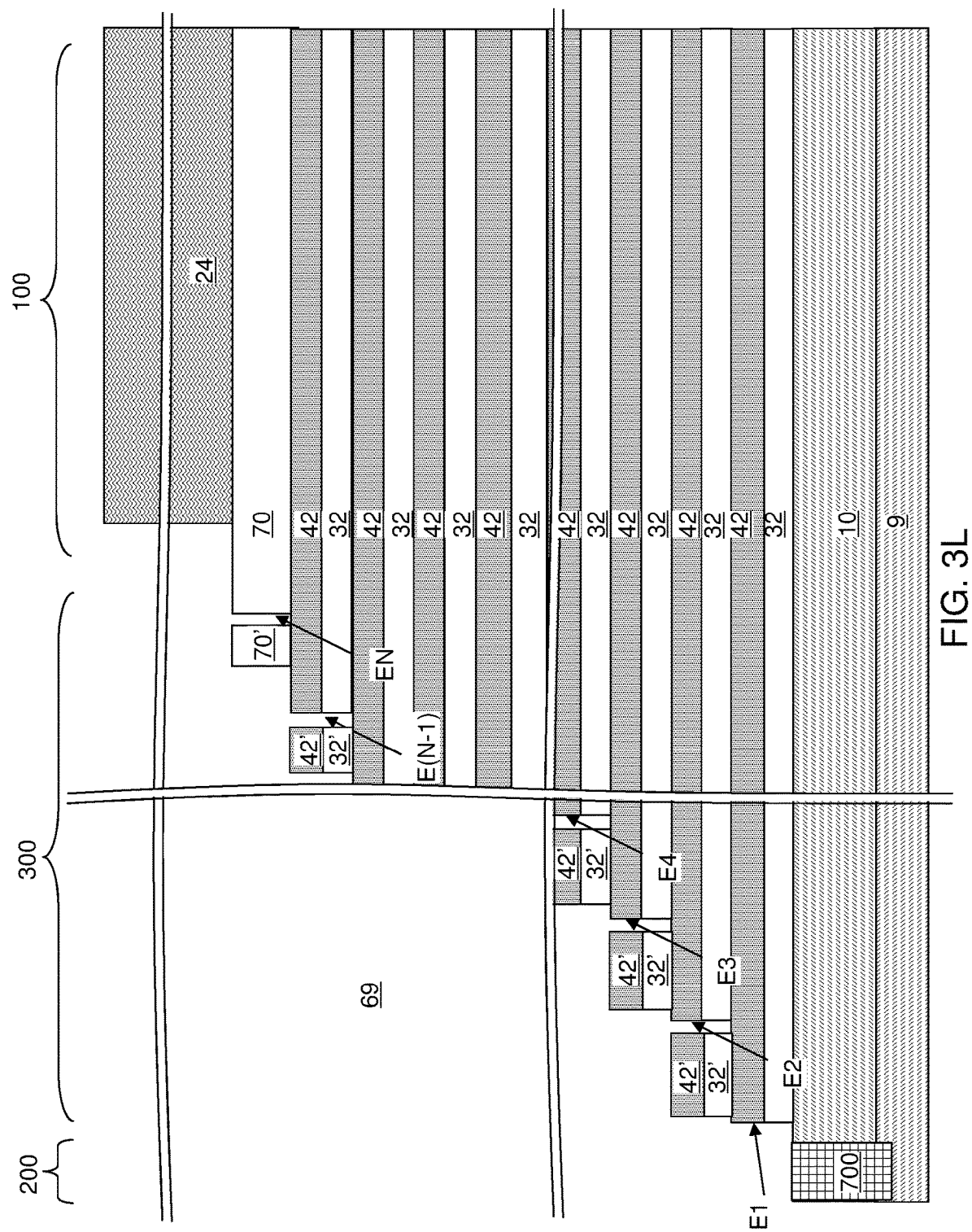
Figure 3N:
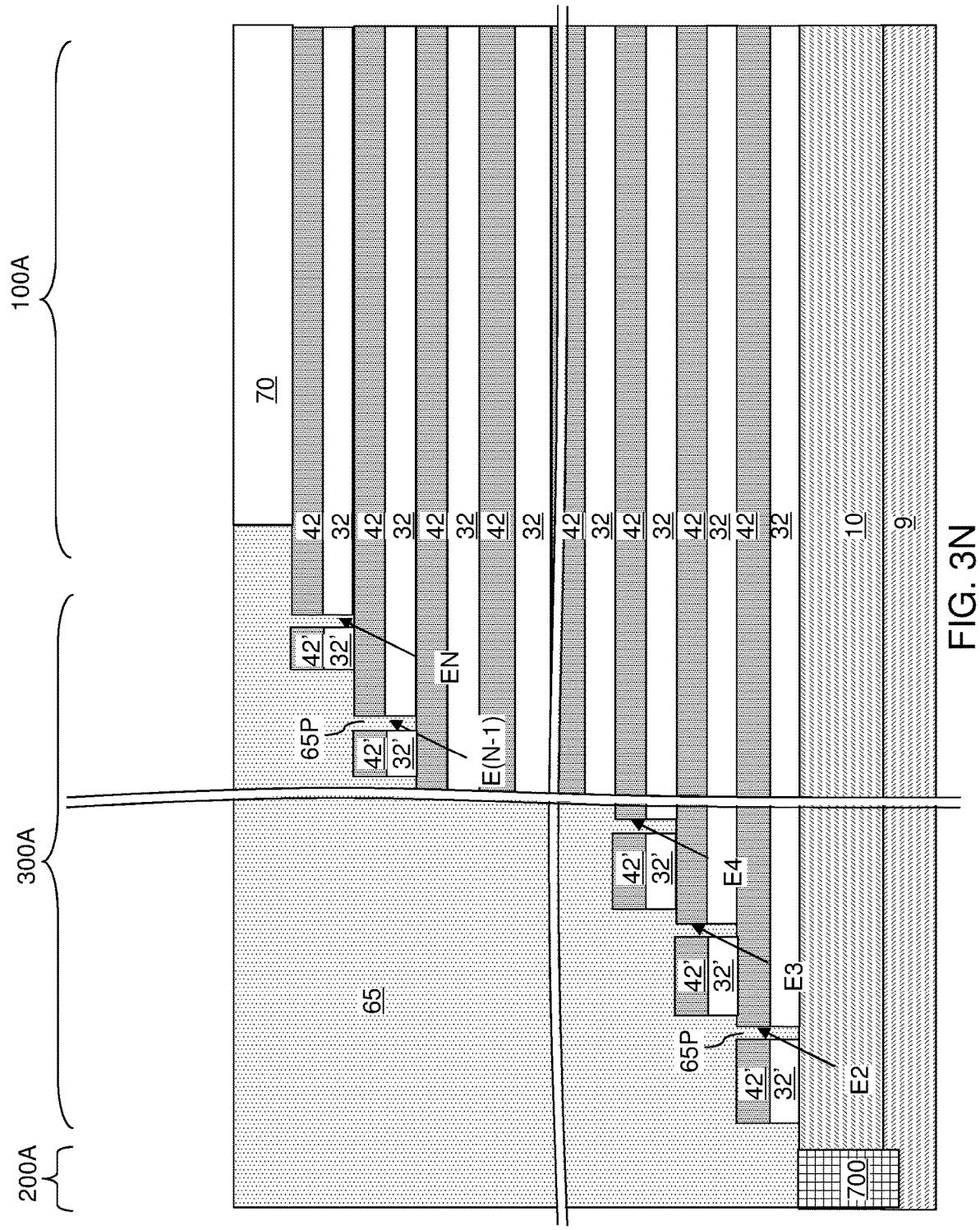

FIGS. 3A-3N are schematic sequential vertical cross-sectional views of the exemplary structure during formation of stepped surfaces and a stepped dielectric material portion according to an embodiment of the present disclosure. The exemplary structure may comprise multiple staircase regions 300 at different locations, the proximity to neighboring staircase regions 300 may be different among the staircase regions 300. While FIGS. 3A-3N illustrate the structural changes in a single staircase region 300, the same type of structural changes occur at different staircase regions 300. However, the dimensions of the patterns that are formed within the staircase regions 300 generally differ from staircase region 300 to staircase region 300. Specifically, the trimming distance of a trimmable mask material layer 24 during each trimming step may differ from staircase region 300 to staircase region 300 due to different pattern factors (which are local percentage of areas that are not masked by the trimmable mask material layer 24) within different staircase regions 300 or by the location of the trimmable mask layer 24 over the substrate (9, 10), such as a silicon wafer. For example, the portions of the trimmable mask layer 24 may be shorter in portions of the wafer near the kerf regions than in portions near memory plane regions. In other words, the slimming of the trimmable mask layer 24 may be greater near the kerf regions than near the memory plane regions. Thus, while FIGS. 3A-3N illustrate the structural changes in a single staircase region 300, it is understood that similar structural changes occur in different staircase regions 300 within changes in lateral dimensions of the trimmable mask material layer 24 caused by different trimming distances for each trimming process during formation of the stepped surfaces in each staircase region 300. According to an aspect of the present disclosure, the pitch for the step-defining edges may be the same across all of the staircase regions 300. Thus, despite the variations in the lateral dimensions of the trimmable mask material layer 24 across the different staircase regions 300, the pitch of the vertical steps within each set of stepped surfaces in a respective staircase region 300 that replicate the pitch of the step-defining edges of the dummy steps can be the same across all sets of stepped surfaces as will be described below. Thus, the addition of the dummy steps lead to a more uniform step lateral dimensions across all regions of the silicon wafer 9.

Referring to FIG. 3A, a trimmable mask material layer 24 can be formed over the insulating strips 70' and the insulating cap layer 70, and can be lithographically patterned. The trimmable mask material layer 24 includes a trimmable mask material, which may comprise a carbon-based material such as photoresist, amorphous carbon, diamond-like carbon, or a material derived therefrom. Upon patterning, the trimmable mask layer 24 extends continuously over the entire areas of the insulating cap layer 70 and the insulating strips 70' other than a peripheral portion of an insulating strip 70' that is most proximal to the peripheral region 200, i.e., the insulating strip 70' that is most distal from the memory array region 100. For example, a trimmable mask material can be applied over the insulating strips 70' and the insulating cap layer 70. The trimmable mask material may cover the line shaped spaces and the backside trench location areas 79L between the insulating strips 70'. The trimmable mask material can be lithographically patterned to form a straight vertically-extending edge that laterally extends along the second horizontal direction hd2 over the insulating strip 70' that is most distal from the memory array region 100. In one embodiment, the percentage of the unmasked area (i.e., area uncovered by the trimmable mask layer 24) of the insulating strip 70' that is most distal from the memory array region 100 may be in a range from 5% to 95%, such as from 10% to 90%, and/or from 20% to 80%, of the entire area of the insulating strip 70' that is most distal from the memory array region 100.

Referring to FIG. 3B, a first processing step of a first instance of a unit pattern transfer sequence is performed, which includes an anisotropic etch process that etches portions of the insulating strip 70' that is most distal from the insulating cap layer 70 and etches unmasked portions of the topmost sacrificial material layer 42 and the topmost insulating layer 32 in the alternating stack (32, 42). The trimmable mask layer 24 is employed as an etch mask during the anisotropic etch process. The contour of the region of the exemplary structure that is not masked by the trimmable mask layer 24 is transferred downward through a respective underlying layer stack of a sacrificial material layer 42 and an insulating layer 32 or through a respective insulating strip 70'.

Specifically, the pattern of the first step-defining edge E1 is transferred through the topmost sacrificial material layer 42 and the topmost insulating layer 32 of the alternating stack (32, 42) by the anisotropic etch process. The etch chemistry and the duration of each step of the anisotropic etch process can be selected such that the anisotropic etch process etches the entire thickness of a sacrificial material layer 42 and the entire thickness an insulating layer 32 without overetching any underlying material layer (such as an underlying sacrificial material layer 42) or with minimal collateral overetching of any underlying material layer (such as an underlying sacrificial material layer 42). Generally, the thickness of the insulating strips 70' can be selected such that the anisotropic etch process collaterally etches the entire thickness of the insulating strips 70' without overetching any underlying material layer (such as the topmost sacrificial material layer 42) or with minimal collateral overetching of any underlying material layer (such as the topmost sacrificial material layer 42). As discussed above, the thickness of the insulating strips 70' can be in a range from 100% to 300% of the thickness of each insulating layer 32 to provide this feature.

Stepped surfaces are formed in the staircase region 300. The stepped surfaces include a horizontally-extending surface of a sacrificial material layer 42 that underlies the topmost insulating layer 32, a vertical sidewall of the topmost insulating layer 32, and a vertical sidewall of the topmost sacrificial material layer 42. The stepped surfaces include a vertically-extending surface that includes the pattern of the first step-defining edge E1 in the vertical sidewall of the topmost insulating layer 32 and the vertical sidewall of the topmost sacrificial material layer 42. The lateral position of the first step-defining edge E1 in layers 32 and 42 corresponds to the initial position of the edge E1 in the insulating strips 70' which are most proximal to the peripheral region 200. In contrast, the vertical edge of the trimmable mask layer 24 and the patterned insulating strips 70' may be offset toward the memory array region 100 from the edge E1 in layers 32 and 42. Thus, even if the trimmable mask layer 24 is offset too far from the desired lateral position of the edge E1, the dummy steps keep the lateral position of the edge E1 in layers 32 and 42 at the desired location.

Referring to FIG. 3C, a second processing step of the first instance of the unit pattern transfer sequence is performed, which includes a mask trimming process that isotropically trims the trimmable mask layer 24 at a controlled recess rate. The mask trimming process may comprise a slow ashing process that ashes surface portions of the trimmable mask layer 24 at a controlled ashing rate. The duration of the mask trimming process is selected such that the average trimming distance for the trimmable mask layer 24 across all of the staircase regions is about the same as the uniform pitch of the insulating strips 70' as formed at the processing steps of FIGS. 2A and 2B. As discussed above, the trimming distance for the trimmable etch mask layer 24 may have variations across different staircase regions 300 located over the substrate (9, 10). Thus, the lateral distance between the second step-defining edge E2 and a most proximal vertical sidewall of the trimmable mask layer 24 as formed by the mask trimming process may differ from staircase region 300 to staircase region 300, but the distance between the second step-defining edge E2 and the first step-defining edge E1 is the same as the uniform pitch of the insulating strips (i.e., dummy steps) 70' as formed at the processing steps of FIGS. 2A and 2B. In one embodiment, each of the trimming distances may be in a range from 90% of the uniform pitch and 110% of the uniform pitch, and/or may be in a range from 95% of the uniform pitch and 105% of the uniform pitch, and/or may be in a range from 98% of the uniform pitch and 102% of the uniform pitch, and/or may be in a range from 99% of the uniform pitch and 101% of the uniform pitch.

Referring to FIG. 3D, the first processing step of a second instance of the unit pattern transfer sequence is performed, which includes an anisotropic etch process that etches portions of the insulating strips 70' that are not masked by the trimmable etch mask layer 24 and etches unmasked portions of a respective pair of a sacrificial material layer 42 and an insulating layer 32 that underlie physically exposed surface segments of remaining portions of the alternating stack (32, 42). The trimmable mask layer 24 is employed as an etch mask during the anisotropic etch process. The contour of the region of the exemplary structure that is not masked by the trimmable mask layer 24 is transferred downward through a respective underlying layer stack of a sacrificial material layer 42 and an insulating layer 32 or through a respective insulating strip 70'.

Specifically, the pattern of the first step-defining edge E1 and the second step-defining edge E2 is transferred through a respective pair of a sacrificial material layer 42 and an insulating layer 32 of the alternating stack (32, 42) by the anisotropic etch process. The etch chemistry and the duration of each step of the anisotropic etch process can be selected such that the anisotropic etch process etches the entire thickness of a sacrificial material layer 42 and the entire thickness an insulating layer 32 without overetching any underlying material layer (such as an underlying sacrificial material layer 42) or with minimal collateral overetching of any underlying material layer (such as an underlying sacrificial material layer 42). Each instance of the unit processing sequence may have identical set of process conditions. As such, the first processing step of the second instance of the unit pattern transfer sequence may be the same as the first processing step of the first instance of the unit pattern transfer sequence.

The stepped surfaces in the staircase region 300 can be shifted downward and additional surfaces can be added to the stepped surfaces. The stepped surfaces include a horizontally-extending surface of a third sacrificial material layer 42 as counted from the top of the alternating stack (32, 42), a vertically-extending surface that includes a vertical sidewall of a second insulating layer 32 as counted from the top of the alternating stack (32, 42) and a vertical sidewall of a second sacrificial material layer 42 as counted from the top of the alternating stack (32, 42), a horizontally-extending surface of a second sacrificial material layer 42 as counted from the top of the alternating stack (32, 42), and a vertically-extending surface that includes a vertical sidewall of a topmost insulating layer 32 and a vertical sidewall of a topmost sacrificial material layer 42.

A patterned portion of the topmost sacrificial material layer 42 that replicates the pattern of the insulating strip 70' as provided at the processing steps of FIGS. 3B and 3C comprises a dielectric material pad 42'. A patterned portion of the topmost insulating layer 32 that replicate the pattern of the insulating strip 70' as provided at the processing steps of FIGS. 3B and 3C comprises an insulating pad 32. As such, the dielectric material pad 42' has the same material composition as the sacrificial material layers 42, and the insulating pad 32' has the same material composition as the insulating layers 32. The combination of the pads (32', 42') forms a temporary dummy step. A stepped cavity 69 is formed over the stepped surfaces and the stack of the dielectric material pad 42' and the insulating pad 32' (i.e., temporary dummy step (32', 42')).

Referring to FIG. 3E, a second processing step of the second instance of the unit pattern transfer sequence is performed, which includes a mask trimming process that isotropically trims the trimmable mask layer 24 at a controlled recess rate. The mask trimming process may comprise a slow ashing process that ashes surface portions of the trimmable mask layer 24 at a controlled ashing rate. The duration of the mask trimming process is selected such that the average trimming distance for the trimmable mask layer 24 across all of the staircase regions is about the same as the uniform pitch of the insulating strips 70' as formed at the processing steps of FIGS. 2A and 2B. The trimming distance for the trimmable etch mask layer 24 may have variations across different staircase regions 300 located over the substrate (9, 10). Thus, the lateral distance between the third step-defining edge E3 and a most proximal vertical sidewall of the trimmable mask layer 24 as formed by the mask trimming process may differ from staircase region 300 to staircase region 300, but the lateral distance between each neighboring pair of step-defining edges (E1, E2, E3, E4, . . . . . E (N+1)) is the same as the uniform pitch of the insulating strips 70' as formed at the processing steps of FIGS. 2A and 2B.

Referring to FIG. 3F, the first processing step of a third instance of the unit pattern transfer sequence is performed, which includes an anisotropic etch process that etches portions of the insulating strips 70' that are not masked by the trimmable etch mask layer 24 and etches unmasked portions of a respective pair of a sacrificial material layer 42 and an insulating layer 32 that underlie physically exposed surface segments of remaining portions of the alternating stack (32, 42). The trimmable mask layer 24 is employed as an etch mask during the anisotropic etch process. The contour of the region of the exemplary structure that is not masked by the trimmable mask layer 24 is transferred downward through a respective underlying layer stack of a sacrificial material layer 42 and an insulating layer 32 or through a respective insulating strip 70'.

Specifically, the pattern of the first step-defining edge E1, the second step-defining edge E2, and the third step-defining edge E3 is transferred through a respective pair of a sacrificial material layer 42 and an insulating layer 32 of the alternating stack (32, 42) by the anisotropic etch process. Each instance of the unit processing sequence may have identical set of process conditions. As such, the first processing step of the third instance of the unit pattern transfer sequence may be the same as the first processing step of the first instance of the unit pattern transfer sequence and the first processing step of the second instance of the unit pattern transfer sequence.

The stepped surfaces in the staircase region 300 can be shifted downward and additional surfaces can be added to the stepped surfaces. The stepped surfaces include a horizontally-extending surface of a fourth sacrificial material layer 42 as counted from the top of the alternating stack (32, 42), a vertically-extending surface that includes a vertical sidewall of a third insulating layer 32 as counted from the top of the alternating stack (32, 42) and a vertical sidewall of a third sacrificial material layer 42 as counted from the top of the alternating stack (32, 42), a horizontally-extending surface of a third sacrificial material layer 42 as counted from the top of the alternating stack (32, 42), a vertically-extending surface that includes a vertical sidewall of a second insulating layer 32 as counted from the top of the alternating stack (32, 42) and a vertical sidewall of a second sacrificial material layer 42 as counted from the top of the alternating stack (32, 42), a horizontally-extending surface of a second sacrificial material layer 42 as counted from the top of the alternating stack (32, 42), and a vertically-extending surface that includes a vertical sidewall of a topmost insulating layer 32 and a vertical sidewall of a topmost sacrificial material layer 42.

The pattern of the stack of the dielectric material pad 42' and the insulating pad 32' (i.e., temporary dummy steps) as provided at the processing steps of FIGS. 3D and 3E is transferred into an underlying sacrificial material layer 42 (i.e., the second sacrificial material layer 42 as counted from the top) and into an underlying insulating layer 32 (i.e., the second insulating layer 32 as counted from the top) to form a stack of a dielectric material pad 42' and an insulating pad 32' that is patterned out of the underlying sacrificial material layer 42 and the underlying insulating layer 32.

A patterned portion of the topmost sacrificial material layer 42 that replicates the pattern of the insulating strip 70' as provided at the processing steps of FIGS. 3D and 3E comprises an additional dielectric material pad 42'. A patterned portion of the topmost insulating layer 32 that replicate the pattern of the insulating strip 70' as provided at the processing steps of FIGS. 3D and 3E comprises an additional insulating pad 32'. Each of the dielectric material pads 42' has the same material composition as the sacrificial material layers 42, and each of the insulating pads 32' has the same material composition as the insulating layers 32. A stepped cavity 69 is present over the stepped surfaces and the stack of the dielectric material pad 42' and the insulating pad 32'.

Referring to FIG. 3G, a second processing step of the third instance of the unit pattern transfer sequence is performed, which includes a mask trimming process that isotropically trims the trimmable mask layer 24 at a controlled recess rate. The trimming distance for the trimmable etch mask layer 24 may have variations across different staircase regions 300 located over the substrate (9, 10). Thus, the lateral distance between the fourth step-defining edge E4 and a most proximal vertical sidewall of the trimmable mask layer 24 as formed by the mask trimming process may differ from staircase region 300 to staircase region 300, but the lateral distance between each neighboring pair of step-defining edges (E1, E2, E3, E4, . . . . E (N+1)) is the same as the uniform pitch of the insulating strips 70' as formed at the processing steps of FIGS. 2A and 2B.

Subsequently, a first processing step of the fourth instance of the unit pattern transfer sequence is performed. Referring to FIG. 3H, a second processing step of the fourth instance of the unit pattern transfer sequence is performed. A first processing step and a second processing step of an i-th instance of the unit pattern transfer sequence can be subsequently performed for each integer starting with 5 and ending with N. The exemplary structure illustrated in FIG. 3H corresponds to one of the processing steps between the fifth instance of the unit pattern transfer sequence and the N-th instance of the unit pattern transfer sequence.

Referring to FIG. 3I, the exemplary structure is illustrated after the first processing step of the (N-2)-th instance of the unit pattern transfer sequence.

Referring to FIG. 3J, the second processing step of the (N-2)-th instance of the unit pattern transfer sequence can be performed.

Referring to FIG. 3K, the first processing step of the (N-1)-th instance of the unit pattern transfer sequence can be performed.

Referring to FIG. 3L, the second processing step of the (N-1)-th instance of the unit pattern transfer sequence can be performed.

Referring to FIG. 3M, the first processing step of the N-th instance of the unit pattern transfer sequence can be performed. Thus, a total of (N-1) instances of the unit pattern transfer sequence can be performed fully, and the first processing step of the N-th instance of the unit pattern transfer sequence can be performed, which transfers the N-th step-defining edge EN into the topmost sacrificial material layer 42 and the topmost insulating layer 32, and also transfers a pattern of an (N+1)-th step defining edge into the insulating cap layer 70.

Generally, multiple iterations (i.e., instances) of a unit pattern transfer sequence can be performed. The unit pattern transfer sequence comprises a first processing step in which unmasked portions of the alternating stack (32, 42) and the insulating strips 70' are etched anisotropically by a respective anisotropic etch process, and a second processing step in which the trimmable mask layer 24 is trimmed by a respective trimming distance. Stepped surfaces comprising vertical sidewalls of the insulating layers 32, vertical sidewalls of the spacer material layers (such as vertical sidewalls of the sacrificial material layers 42), and horizontal surfaces the insulating layers 32 or the spacer material layer (such as the sacrificial material layers 42) are formed each staircase region 300 in which lateral extents of the spacer material layers (such as the sacrificial material layers 42) decrease with a vertical distance from the substrate (9, 10).

Patterned portions of the alternating stack (32, 42) that are formed during the anisotropic etch processes comprise pad stacks (i.e., permanent dummy steps) (32', 42') located on the stepped surfaces. Each of the pad stacks (32', 42') comprises an insulating pad 32' having a same material composition as the insulating layers 32 and a dielectric material pad 42' having a same material composition as the spacer material layers (such as the sacrificial material layers 42).

In one embodiment, each pad stack (32', 42') that is formed during anisotropic etch processes other than a last anisotropic process within the multiple iterations of the unit pattern transfer sequence is etched and removed during a subsequent anisotropic etch process, and the subsequent anisotropic etch process transfers patterns of pre-existing pad stacks (32', 42') into a respective underlying insulating layer 32 and a respective underlying spacer material layer (such as a respective underlying sacrificial material layer 42) within the alternating stack (32, 42) prior to removal of the pre-existing pad stacks (32', 42').

In one embodiment, trimming distances among the multiple iterations of the unit pattern transfer sequence may be different within a staircase region 300. Generally, at least one of the trimming distances can be different from the uniform pitch of the insulating strips 70' as formed at the processing steps of FIGS. 2A and 2B. In one embodiment, the sacrificial material layers 42 as formed at the processing steps of FIGS. 2A and 2B comprise silicon nitride, and the insulating layers 32 as formed at the processing steps of FIGS. 2A and 2B comprise silicon oxide. In this case, the dielectric material pads 42' comprise silicon nitride, and the insulating pads 32' comprise silicon oxide. Thus, each dummy step comprises a vertical pad stack of a silicon oxide pad and a silicon nitride pad. The dummy steps are laterally offset from the backside trench location areas 79L in the second horizontal direction hd2.

An alternating stack of insulating layers 32 and spacer material layers (such as the sacrificial material layers 42) can be located over a substrate (9, 10). Stepped surfaces comprising vertical sidewalls of the insulating layers 32 are present in each staircase region 300 in which lateral extents of the spacer material layers decrease with a vertical distance from the substrate (9, 10). Pad stacks (32', 42') can be located on the stepped surfaces. Each of the pad stacks (32', 42') comprises an insulating pad 32' having a same material composition as the insulating layers 32, and a dielectric material pad 42' having a different material composition than the insulating layers 32 and having sidewalls that are vertically coincident with sidewalls of the insulating pad 32'. Each of the pad stacks (32', 42') is located on a respective horizontal surface within the stepped surfaces.

In one embodiment, each of the insulating pads 32' has a same vertical thickness as a respective insulating layer 32 of the insulating layers 32 that is vertically spaced from the substrate (9, 10) by a same vertical distance. In one embodiment, each of the dielectric material pads 42' has a same vertical thickness as a respective sacrificial material layer 42 that is located above a horizontal plane including a bottom surface of a respective dielectric material portion 42' and below a horizontal plane including a top surface of the respective dielectric material portion 42'. In other words, each of the dielectric material pads 42' has a same vertical thickness as a respective sacrificial material layer 42 located at a same vertical distance from the substrate (9, 10).

In one embodiment, laterally neighboring pairs of vertical surfaces of the stepped surfaces are laterally spaced apart along a first horizontal direction hd1 by a uniform pitch, which is the same as the uniform pitch of the insulating strips 70' as formed at the processing steps of FIGS. 2A and 2B. In one embodiment, the pad stacks (32' 42') may comprise at least two pad stacks (32', 42') having different lateral dimensions along the first horizontal direction hd1. Generally, the differences in the lateral dimensions among the pad stacks (32', 42') may be caused by the variations in the trimming distance of the trimmable etch mask layer 24 due to process variations of the multiple iterations of the trimming processes and/or due to the location of the staircase regions 300 (e.g., closer to or further from the kerf region). In one embodiment, each of the pad stacks (32' 42') may have a lateral width along the first horizontal direction hd1 that is less than the uniform width of the insulating strips 70' along the first horizontal direction hd1 as formed at the processing steps of FIGS. 2A and 2B.

Generally, horizontal surfaces within the stepped surfaces have a same length along the first horizontal direction hd1 that is perpendicular to vertical surfaces of the stepped surfaces. The same length of the horizontal surfaces of the stepped surfaces is the same as the uniform pitch of the insulating strips 70' as formed at the processing steps of FIGS. 2A and 2B. As such, the length of the horizontal surfaces within the stepped surfaces in all of the staircase regions 300 can be uniform irrespective of whether the staircase region is located close to or far from a kerf region, and can be the same as the uniform pitch of the insulating strips 70' as formed at the processing steps of FIGS. 2A and 2B. Accordingly, the length of the horizontal surfaces within the stepped surfaces in all of the staircase regions 300 is not determined by the trimming distances, but is determined by the uniform pitch of the insulating strips 70' as formed at the processing steps of FIGS. 2A and 2B. Thus, the length of the horizontal surfaces within the stepped surfaces in all of the staircase regions 300 can be determined by a single lithographic step, and can be uniform across all of the staircase regions 300.

In one embodiment, each of the pad stacks (32', 42') has a respective length along the first horizontal direction hd1 that is less than the same length of the horizontal surfaces within the stepped surfaces (i.e., the uniform pitch of the insulating strips 70' as formed at the processing steps of FIGS. 2A and 2B).

Figure 3O:
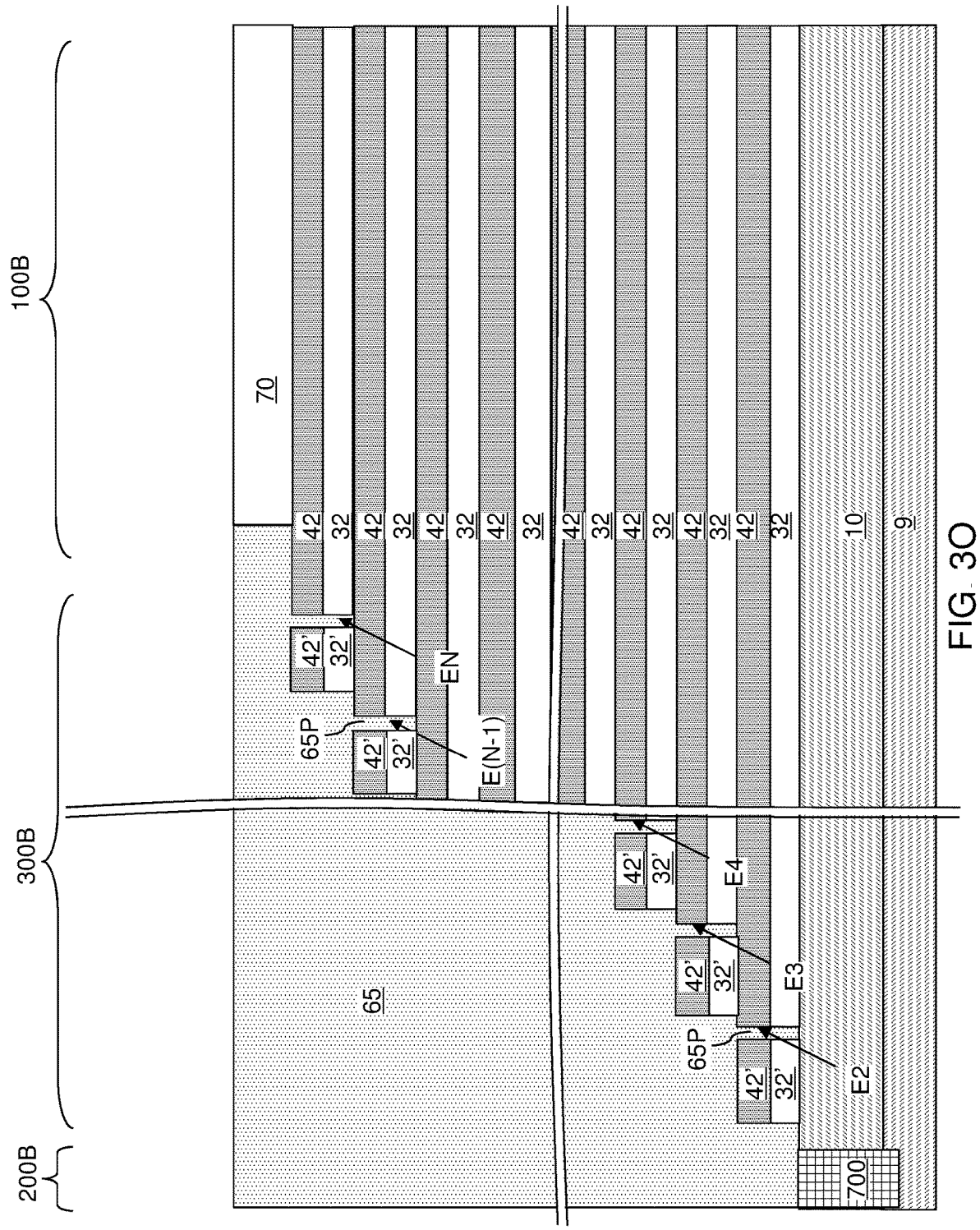

Referring to FIGS. 3N and 3O, two regions of the exemplary structure including two different staircase regions 300A and 300B are illustrated. The different staircase regions (300A, 300B) may have different trimming distances at one, at a plurality, or at each of the trimming steps of the multiple instances of the unit pattern transfer sequence. Accordingly, the different staircase regions (300A, 300B) may have a respective set of pad stacks (32', 42') such that pad stacks (32', 42') located at a same level (i.e., at a same vertical distance from the substrate (9, 10)) have different widths along the first horizontal direction hd1. The different staircase regions (300A, 300B) may be located between respective peripheral regions (200A, 200B) and respective memory array regions (100A, 100B) over different portions of the substrate (9, 10) (e.g., at different distances from a kerf region).

A stepped dielectric material portion 65 (i.e., an insulating fill material portion) can be formed in each stepped cavity 69 by deposition of a dielectric material therein. For example, a dielectric material such as silicon oxide can be deposited in each stepped cavity 69. Excess portions of the deposited dielectric material can be removed from above the top surface of the insulating cap layer 70, for example, by chemical mechanical planarization (CMP). Each remaining portion of the deposited dielectric material filling a respective stepped cavity 69 constitutes the stepped dielectric material portion 65. If silicon oxide is employed for the stepped dielectric material portion 65, the silicon oxide of the stepped dielectric material portion 65 may, or may not, be doped with dopants such as B, P, and/or F.

Each stepped dielectric material portion 65 can have a stepped bottom surface that continuously extends from the substrate (9, 10) to the horizontal plane including the topmost surface of the alternating stack (32, 42) and the pad stacks (32', 42'). The stepped bottom surface contacts surface segments of the stepped surfaces and the pad stacks (32', 42') and overlies a portion of the alternating stack (32, 42) that is located in the staircase region 300. In one embodiment, the stepped dielectric material portion 65 comprises a plurality of downward-protruding portions 65P. Each of the plurality of downward-protruding portions 65P may be located between a respective pad stack (32', 42') and vertically neighboring pair of a respective insulating layer 32 and a respective sacrificial material layer 42 within the alternating stack (32, 42).

Figure 4A:
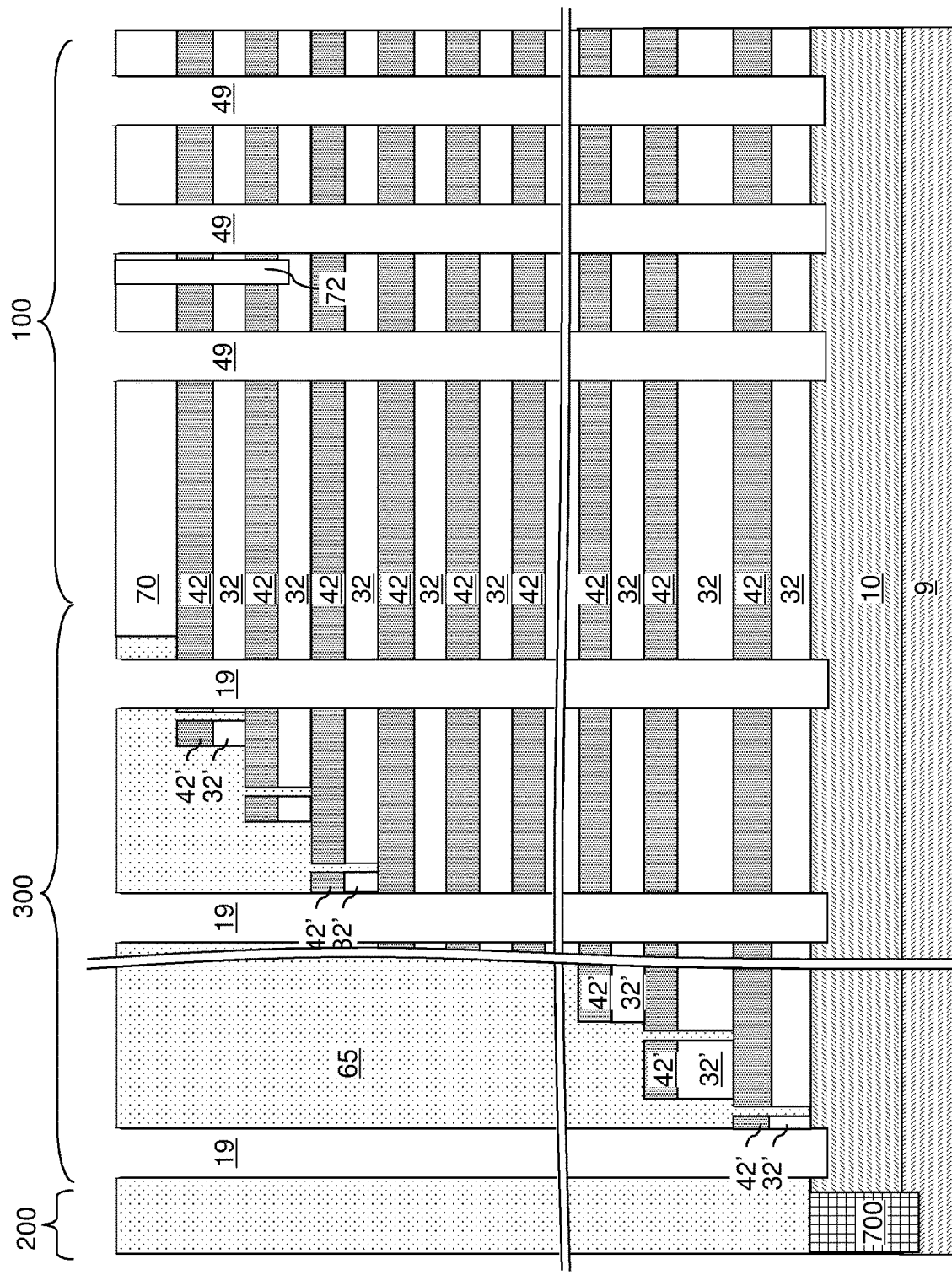
FIG. 4A is a schematic vertical cross-sectional view of the exemplary structure after formation of memory openings and support openings according to an embodiment of the present disclosure.
Figure 4B:
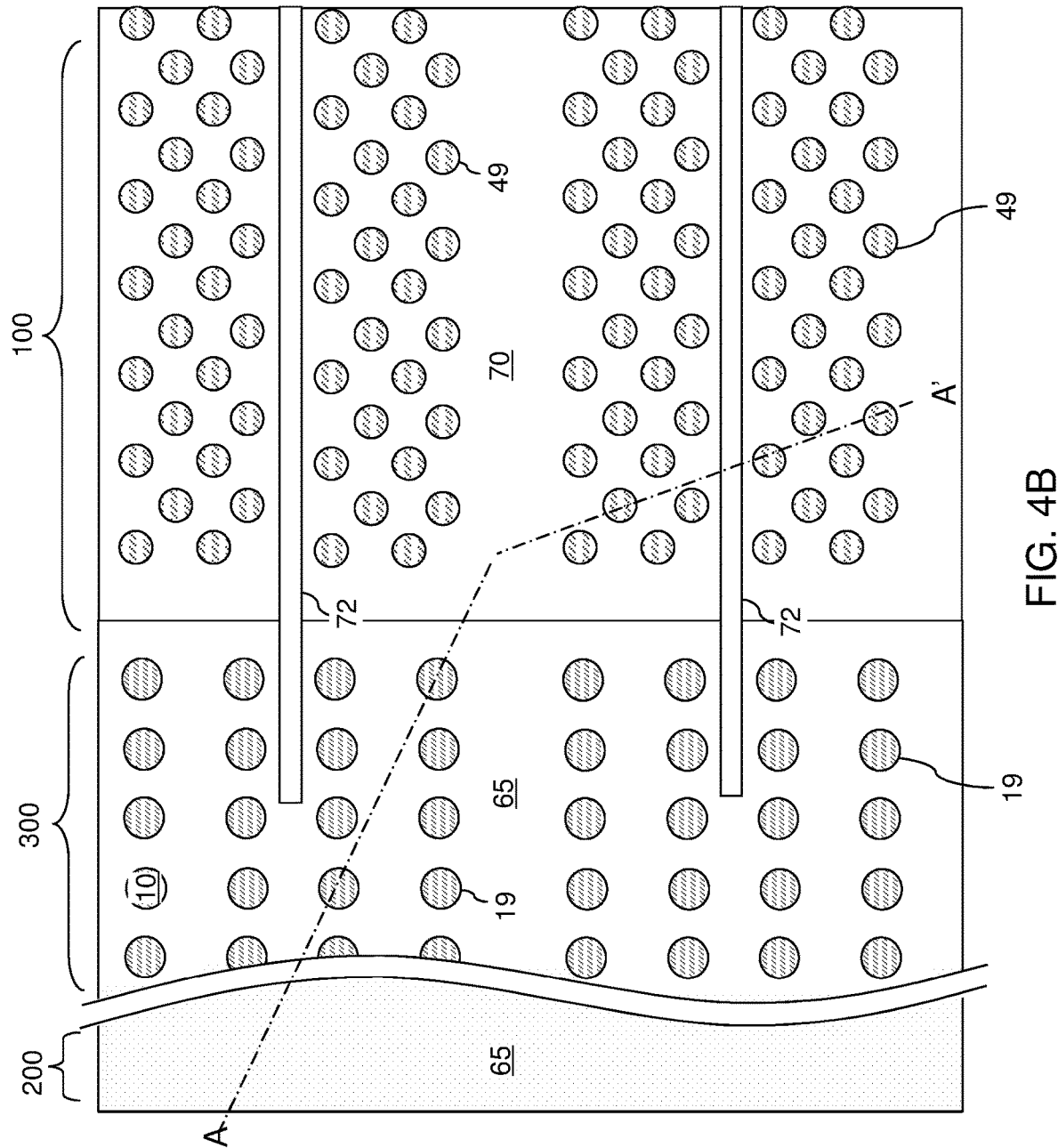
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a ferroelectric polarization direction, or any other memory material that can store date by altering electrical resistivity.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (as embodied as the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements as embodied as portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

Figure 6:
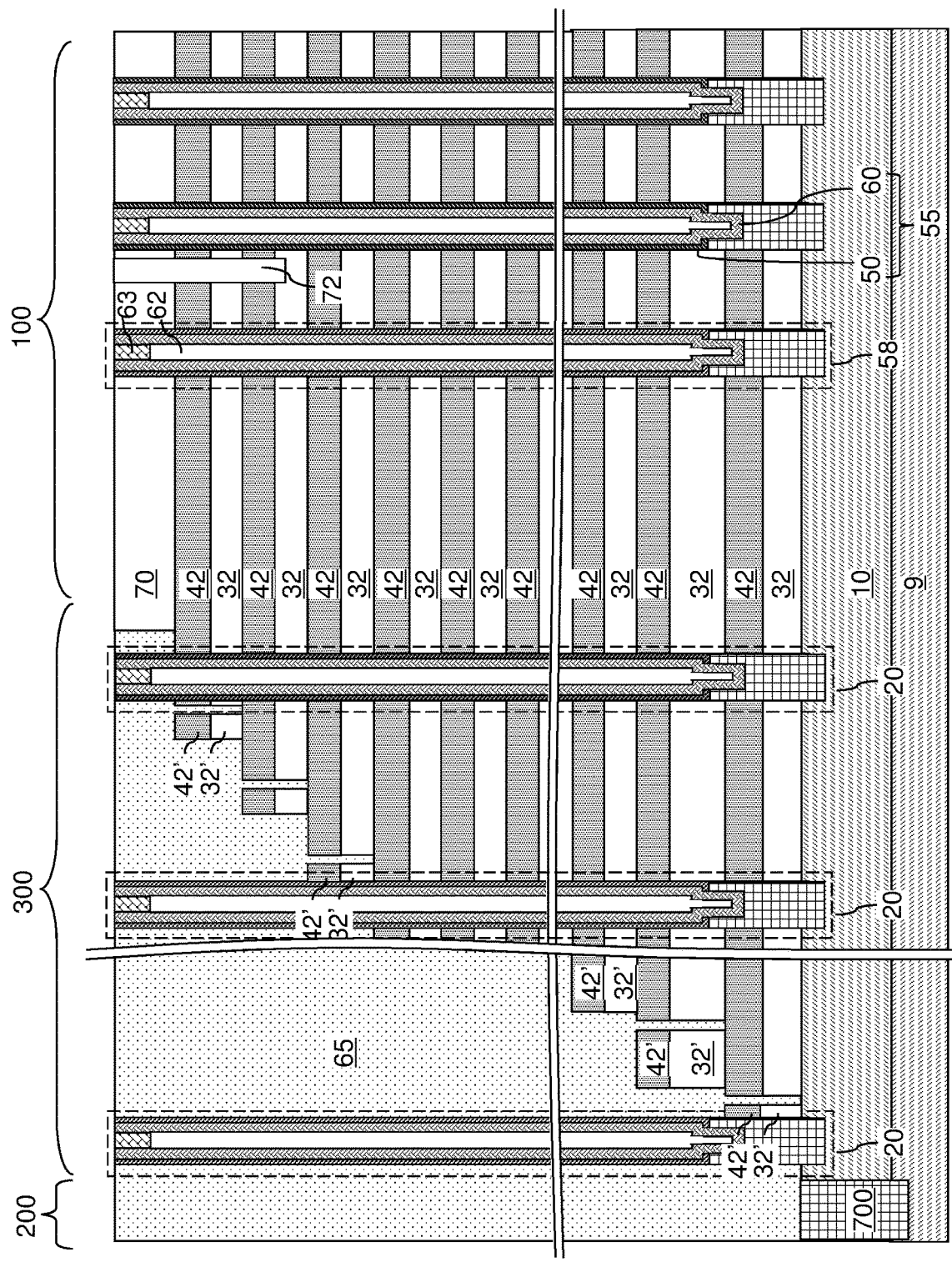
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage or ferroelectric regions (comprising portions of the memory material layer 54) laterally surrounding the dielectric material liner 56, and an optional blocking dielectric layer 52. Alternative memory stack structures including different layer stacks or structures for the memory film 50 and/or for the vertical semiconductor channel 60 may also be used.

Figure 7A:
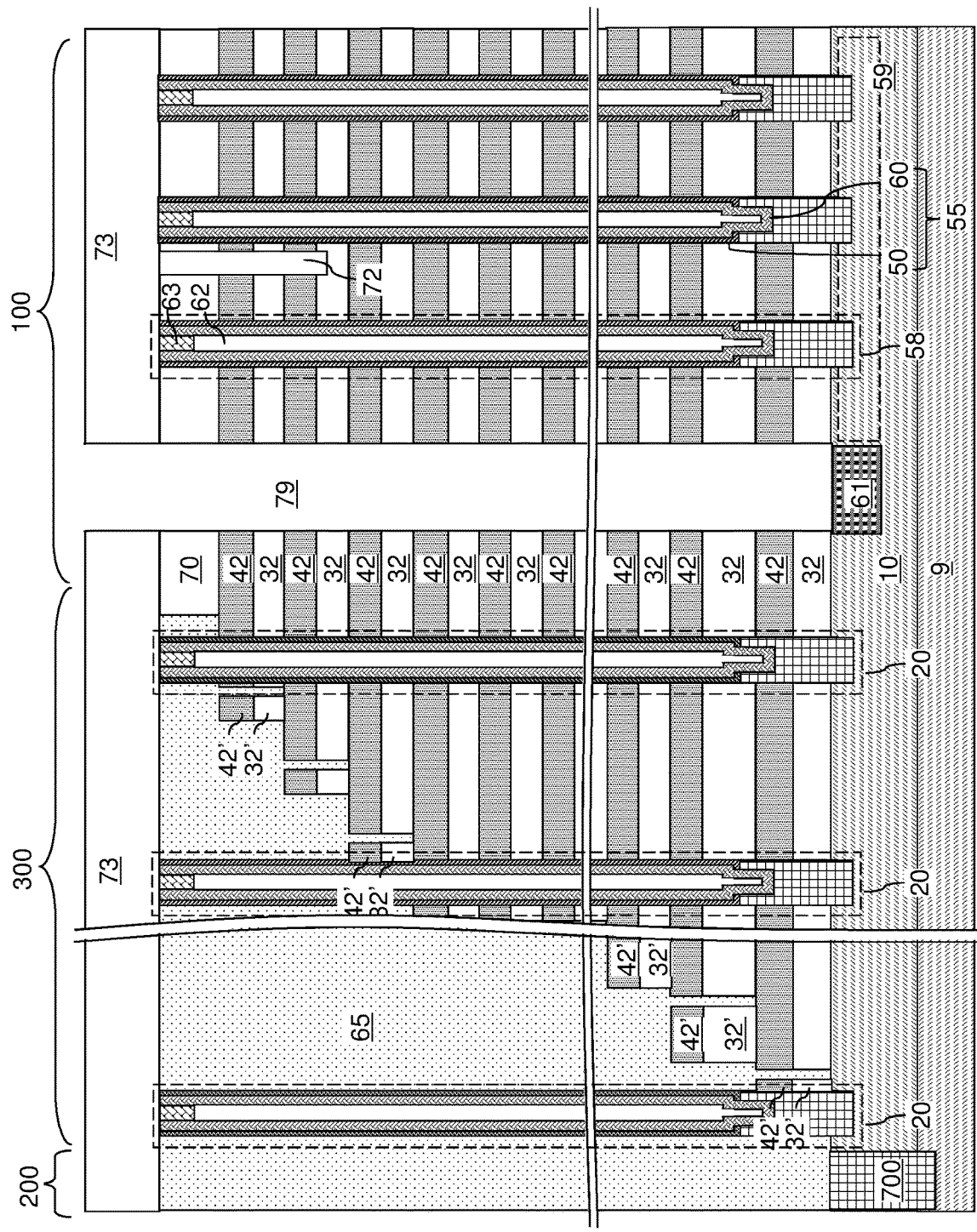
FIG. 7A is a schematic vertical cross-sectional view of the exemplary structure after formation of backside trenches according to an embodiment of the present disclosure.
Figure 7B:
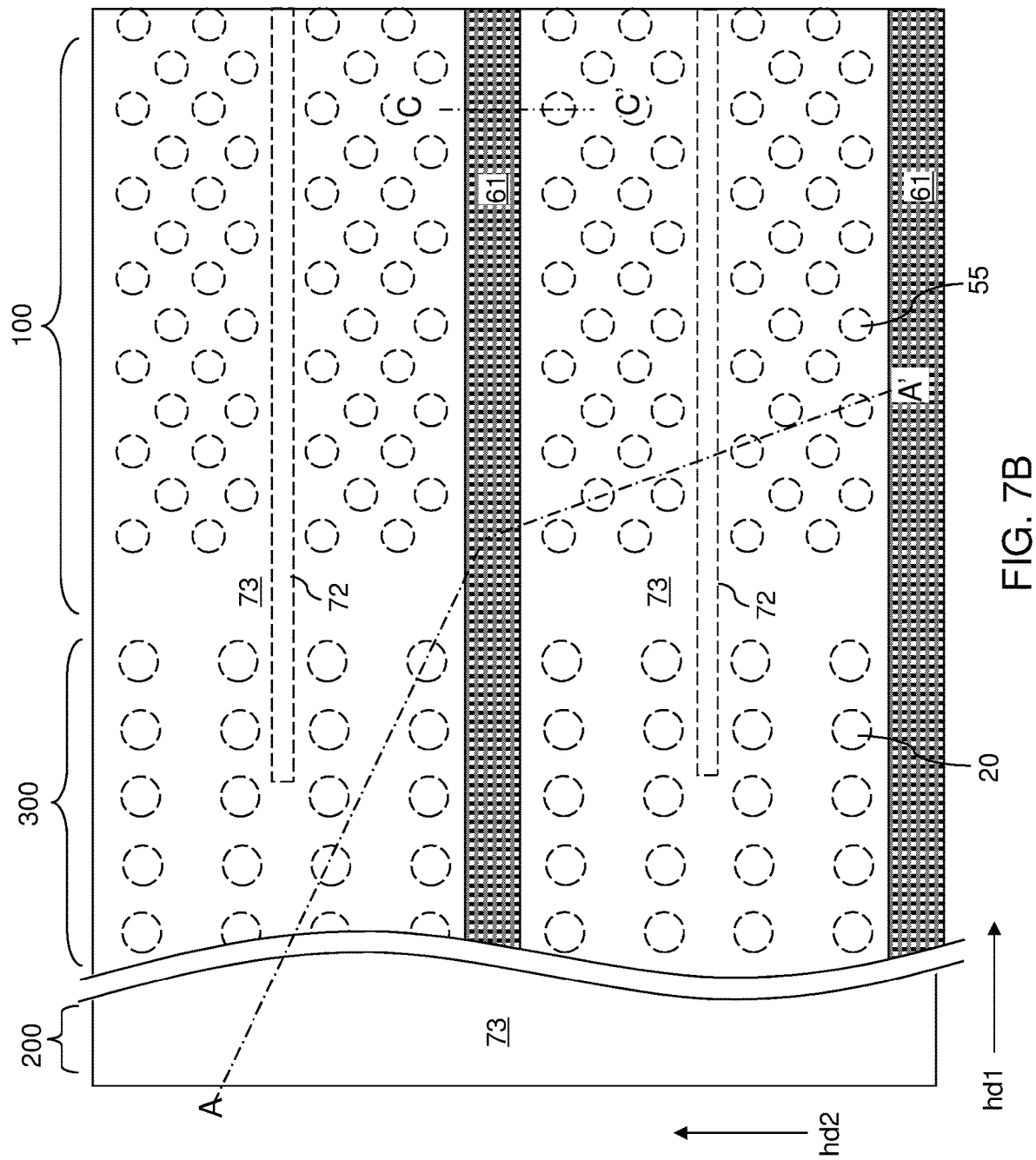
FIG. 7B is a partial see-through top-down view of the exemplary structure of FIG. 7A. The vertical plane A-A' is the plane of the schematic vertical cross-sectional view of FIG. 7A.
Figure 7C:
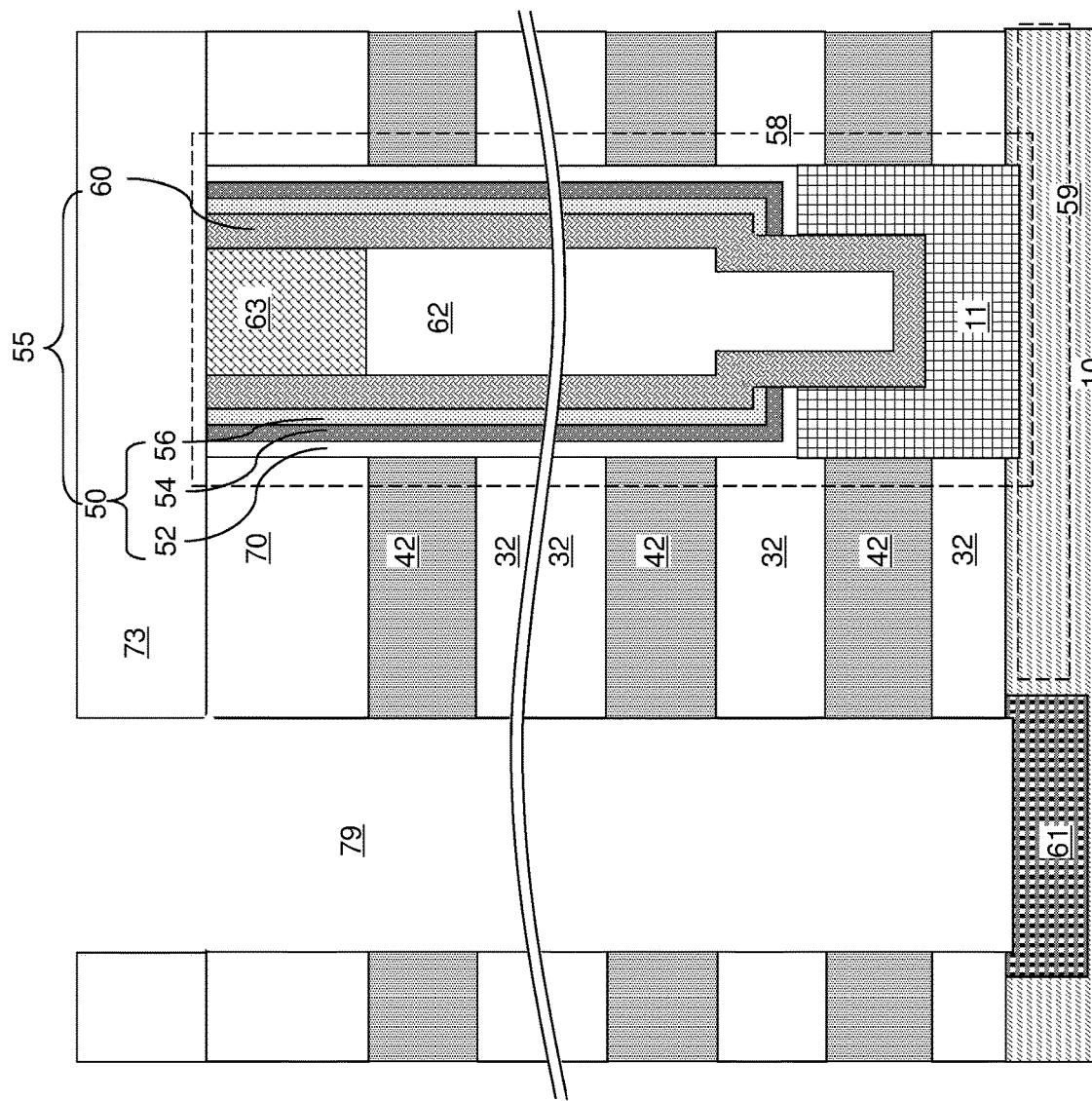
FIG. 7C is a schematic vertical cross-sectional view of the exemplary structure along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in the backside trench location areas 79L between clusters of memory opening fill structures 58. The pattern in the photoresist layer can be transferred through the contact-level dielectric layer 73, the alternating stack (32, 42) and/or the stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction (e.g., word line direction) hd1 and can be laterally spaced apart among one another along a second horizontal direction (e.g., bit line direction) hd2 that is perpendicular to the first horizontal direction hd1. The memory stack structures 55 can be arranged in rows that extend along the first horizontal direction hd1. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 8:
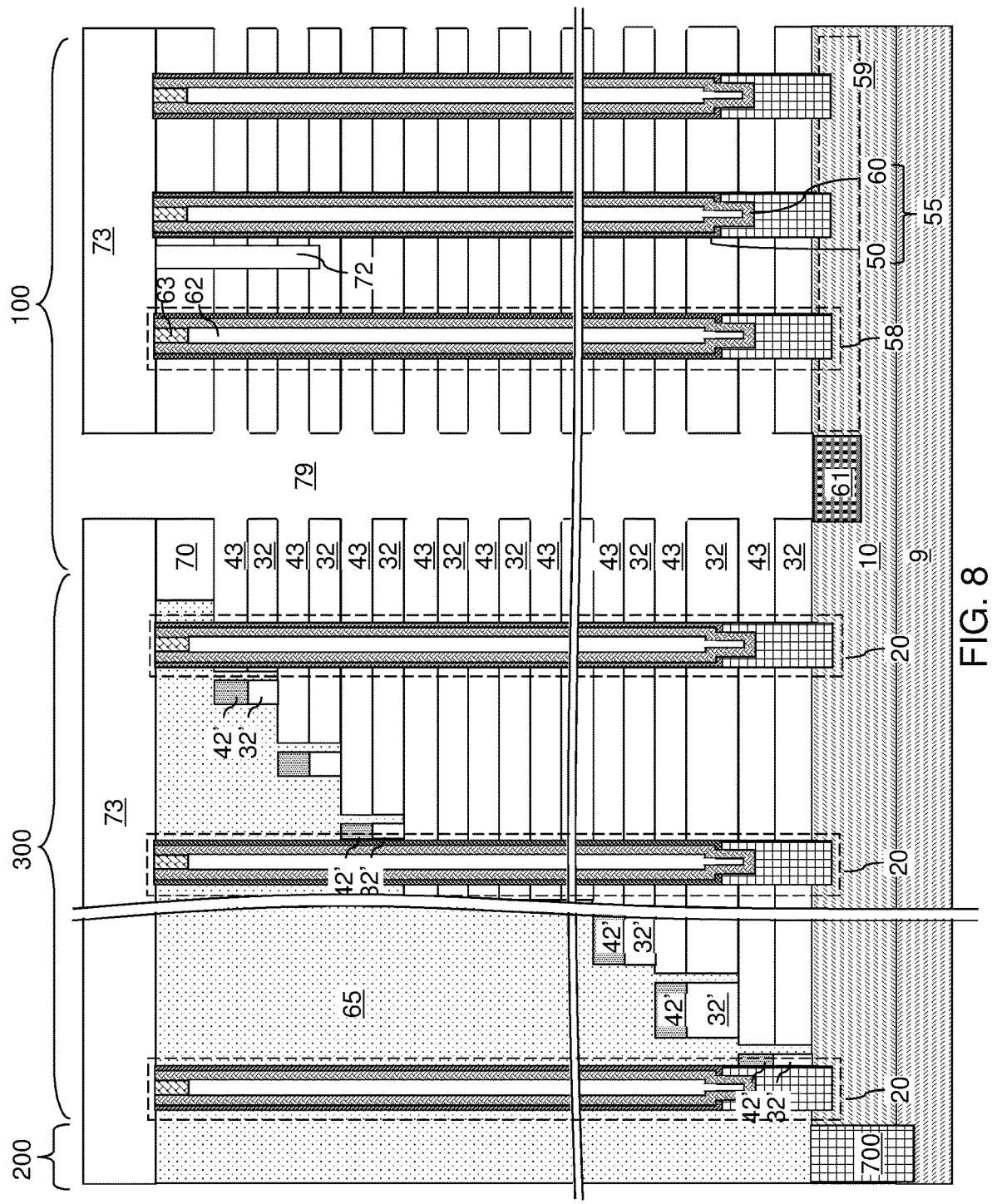
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

However, the etchant provided into the backside trenches 79 does not reach the dielectric material pads 42' because the dielectric material pads 42' are laterally offset from the backside trenches 79 along the second horizontal direction (e.g., along the bit line direction) hd2. In other words, since the dielectric material pads 42' are laterally offset from the backside trench location areas 79L, and the backside trenches 79 are formed in the backside trench location areas 79L, the dielectric material pads 42' are also laterally offset from the backside trenches 79. Therefore, the dielectric material pads 42' are not removed during the etching step illustrated in FIGS. 8 and 9A.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9B:
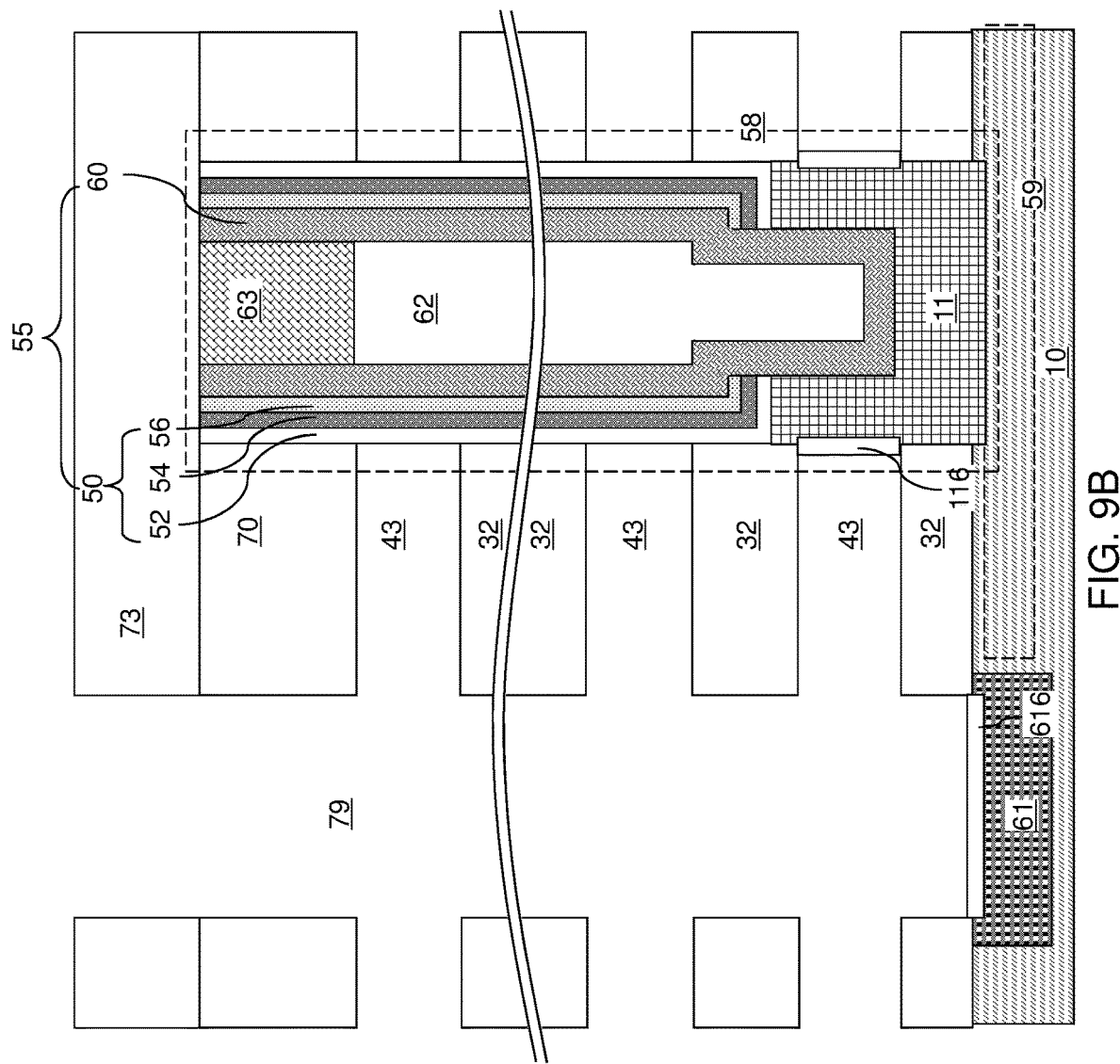

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 9C:
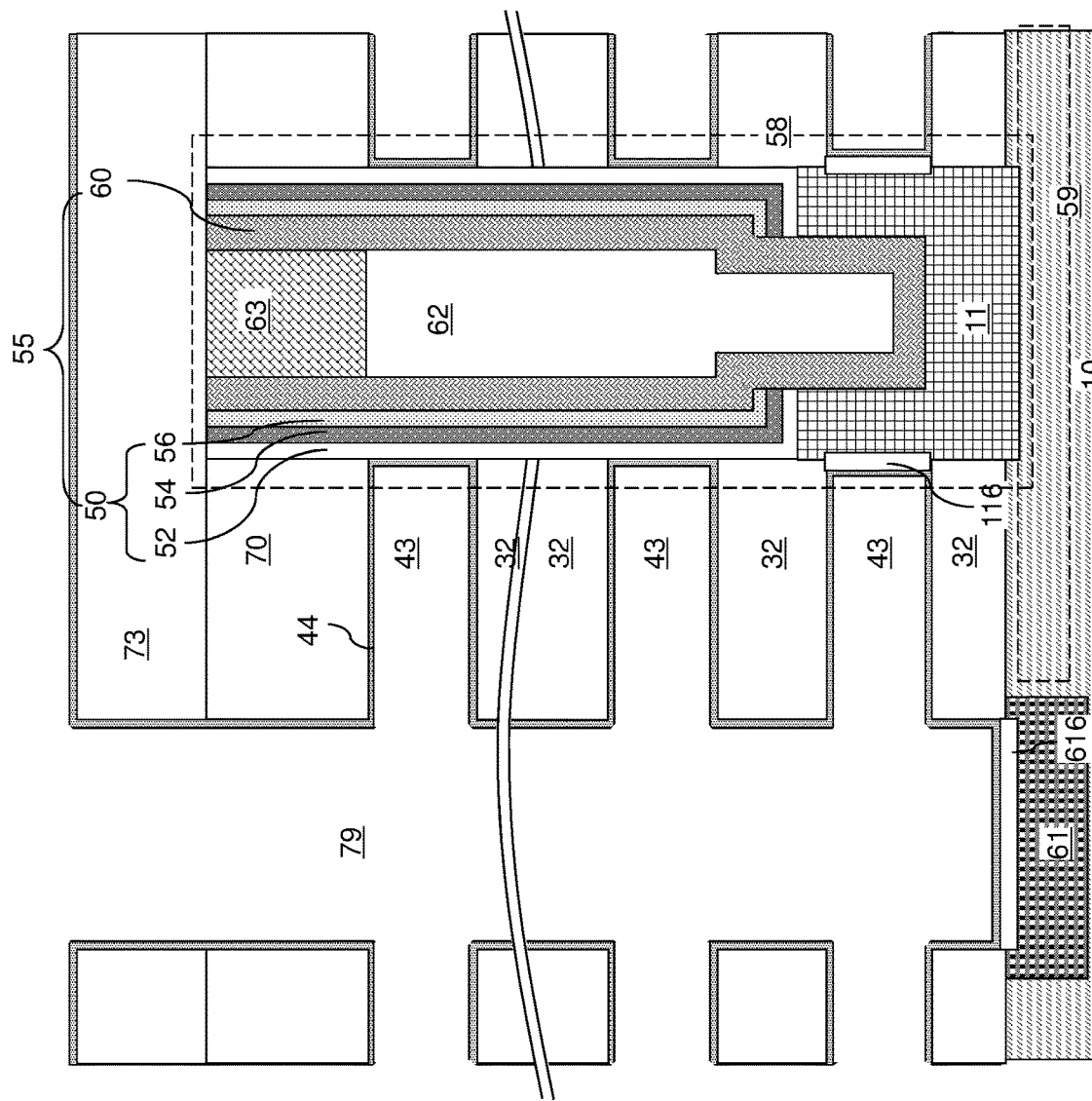

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 9D:
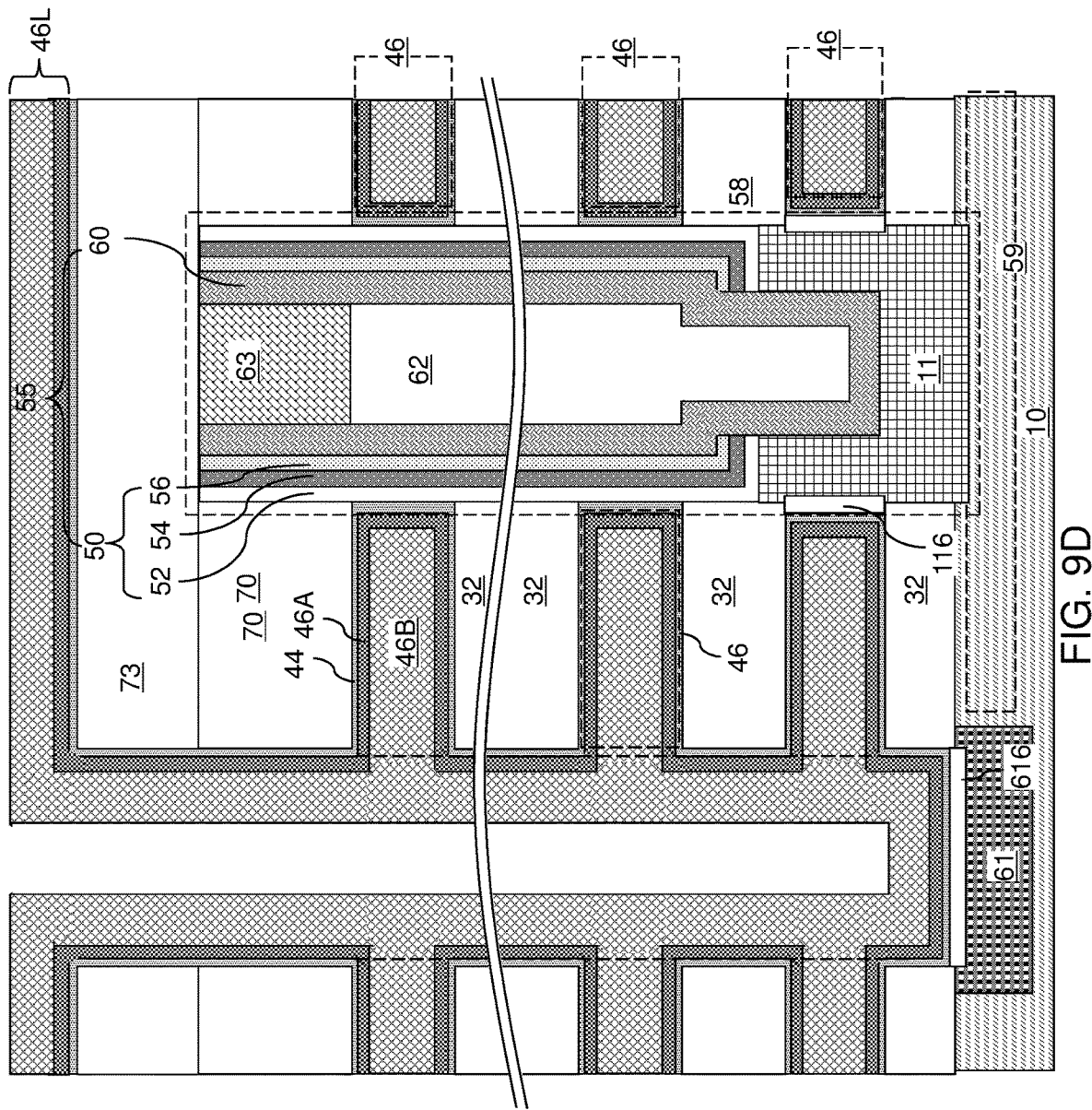

Referring to FIG. 9D, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 10A:
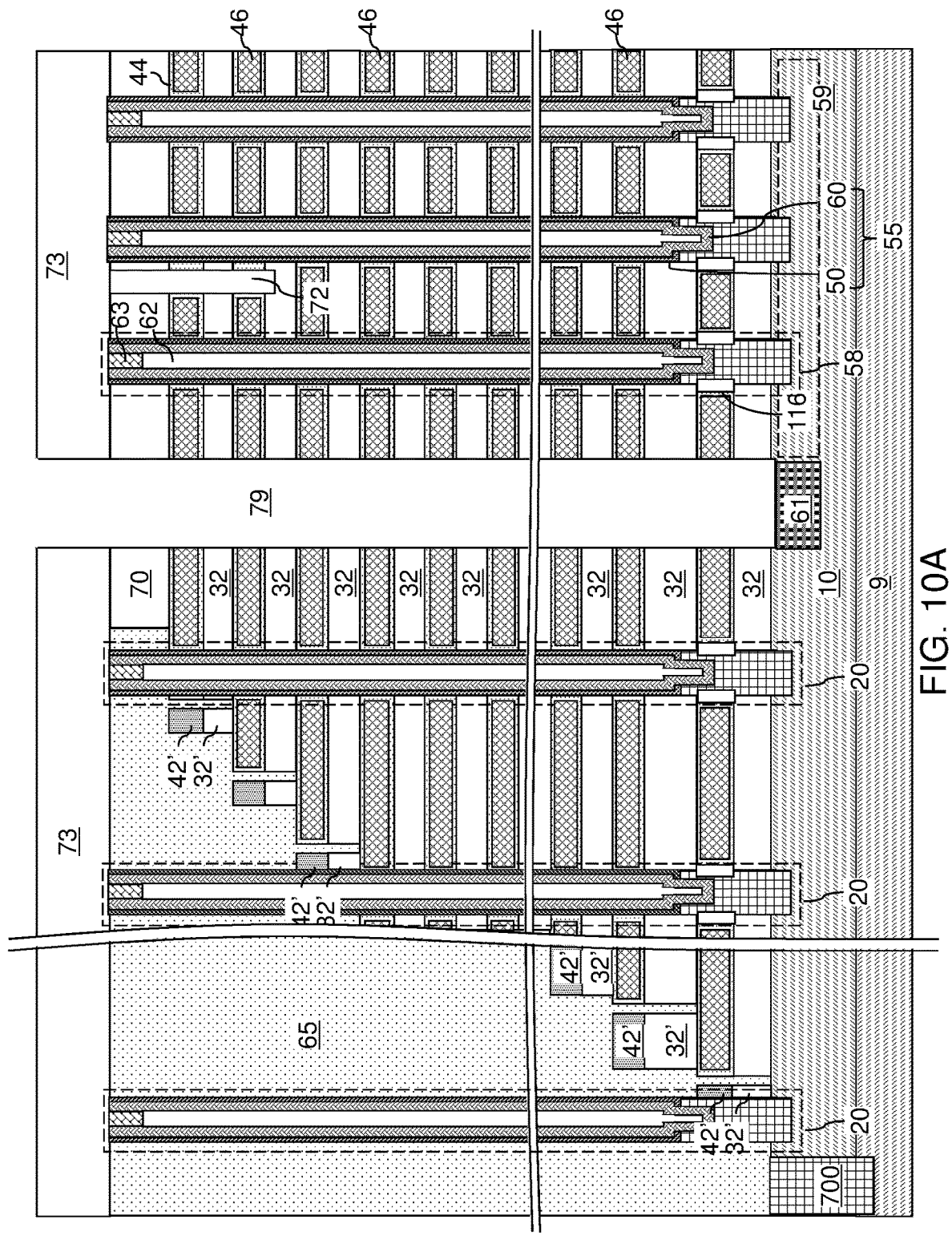
FIG. 10A is a schematic vertical cross-sectional view of the exemplary structure after removal of a deposited conductive material from within the backside trench according to an embodiment of the present disclosure.
Figure 10B:
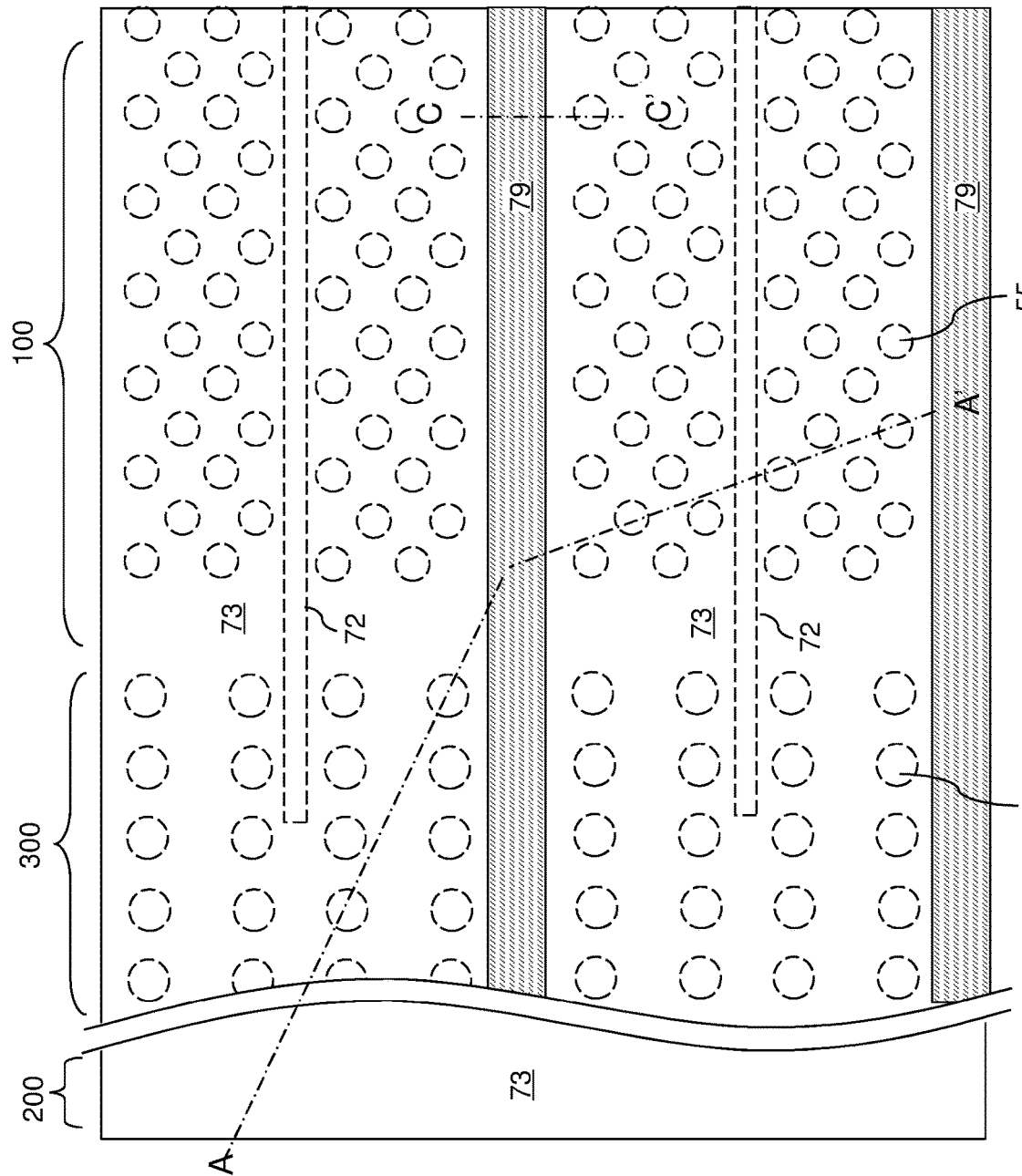
FIG. 10B is a partial see-through top-down view of the exemplary structure of FIG. 10A. The vertical plane A-A' is the plane of the schematic vertical cross-sectional view of FIG. 10A.

Referring to FIGS. 10A and 10B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

At least one topmost and at least one bottommost electrically conductive layer 46 within the alternating stack (32, 46) can comprise a respective drain side and source side select gate electrode for the vertical NAND strings. Semiconductor channels (59, 11, 60) extend between each source region 61 and a respective set of drain regions 63. The semiconductor channels (59, 11, 60) include the vertical semiconductor channels 60 of the memory stack structures 55.

An alternating stack of insulating layers 32 and electrically conductive layers 46 can be formed between each laterally neighboring pair of backside trenches 79. The alternating stack (32, 46) includes the pads stacks (32', 42') (i.e., dummy steps) on the horizontal surfaces in the staircase region 300. Generally, each of the dielectric material pads 42' has a same vertical thickness as, or has a greater vertical thickness than, a respective electrically conductive layer 46 of the electrically conductive layers 46 that is located above a horizontal plane including a bottom surface of a respective dielectric material pad 42' and below a horizontal plane including a top surface of the respective dielectric material pad 42'. Specifically, in case the backside blocking dielectric layers 44 are employed, each of the dielectric material pads 42' has a greater vertical thickness than a respective electrically conductive layer 46. The difference in the thickness of a dielectric material pad 42' and an electrically conductive layer 46 located at a same level may be twice the thickness of a backside blocking dielectric layer 44. In case the backside blocking dielectric layers 44 are not employed, each of the dielectric material pads 42' has a same vertical thickness as a respective electrically conductive layer 46. In other words, each of the dielectric material pads 42' has a same vertical thickness as a respective electrically conductive layer 46 located at a same vertical distance from the substrate (9, 10).

In one embodiment, backside blocking dielectric layers 44 are located between each vertically neighboring pair of an insulating layer 32 and an electrically conductive layer 46 within the alternating stack (32, 46). Each electrically conductive layer 46 within the alternating stack (32, 46) is embedded within a respective backside blocking dielectric layer 44, and the stepped surfaces comprise vertical sidewalls of the backside blocking dielectric layers 44. In some embodiments, the stepped surfaces may be patterned such that an insulating layer 32 and an immediately overlying sacrificial material layer 42 have vertically coincident sidewalls in the staircase region at the processing steps FIGS. 4A and 4B. In some embodiments, the stepped surfaces may be patterned such that an insulating layer 32 and an immediately underlying sacrificial material layer 42 have vertically coincident sidewalls in the staircase region at the processing steps FIGS. 4A and 4B. In one embodiment, the stepped surfaces comprise horizontal surface segments of the insulating layers 32 or horizontal surface segments of the backside blocking dielectric layers 44.

Figure 11:
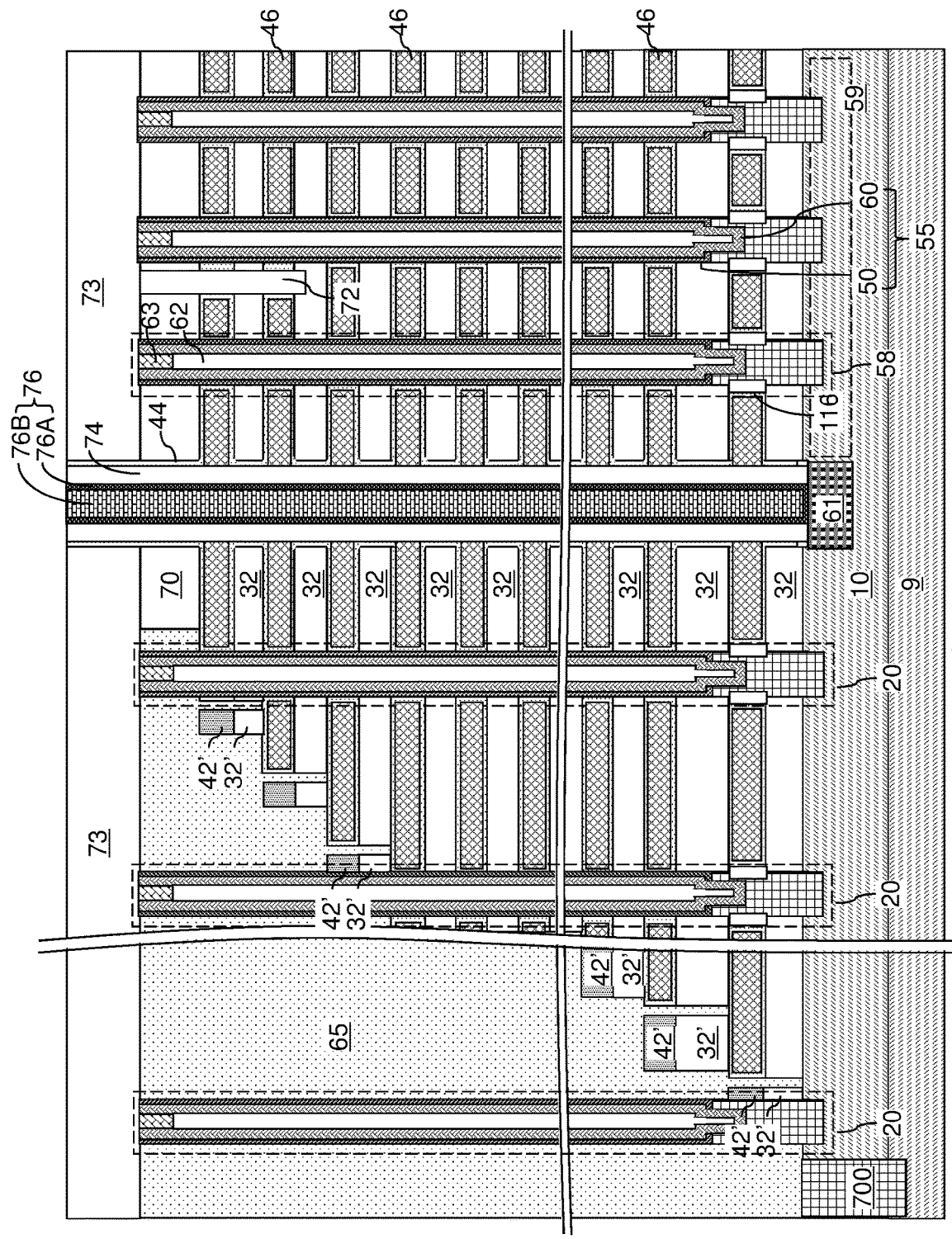
FIG. 11 is a schematic vertical cross-sectional view of the exemplary structure after formation of an insulating spacer and a backside contact structure according to an embodiment of the present disclosure.

Referring to FIG. 11, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TIN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60, as will be described in more detail below with respect to FIG. 14.

Figure 12A:
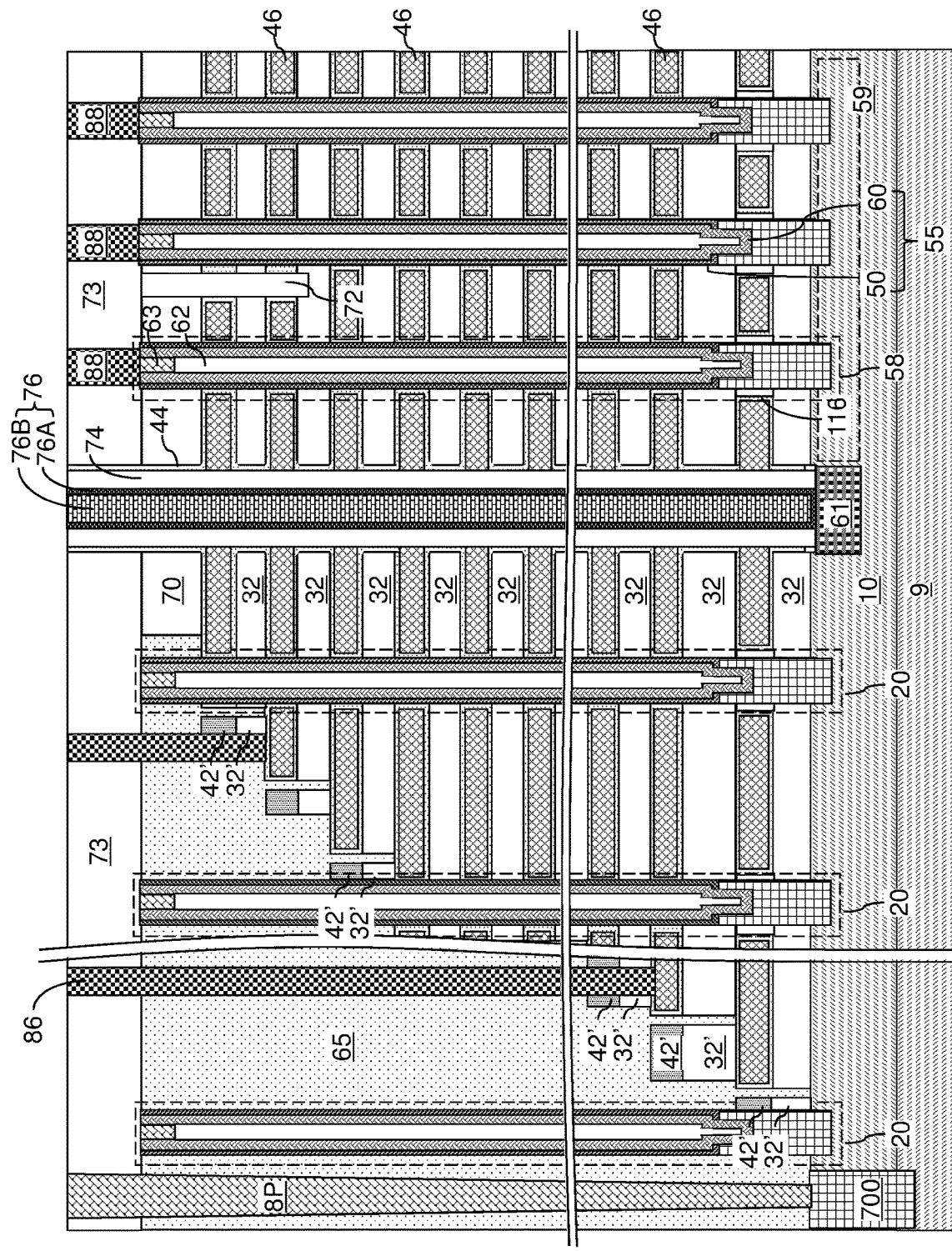
FIG. 12A is a schematic vertical cross-sectional view of the exemplary structure after formation of additional contact via structures according to an embodiment of the present disclosure.
Figure 12B:
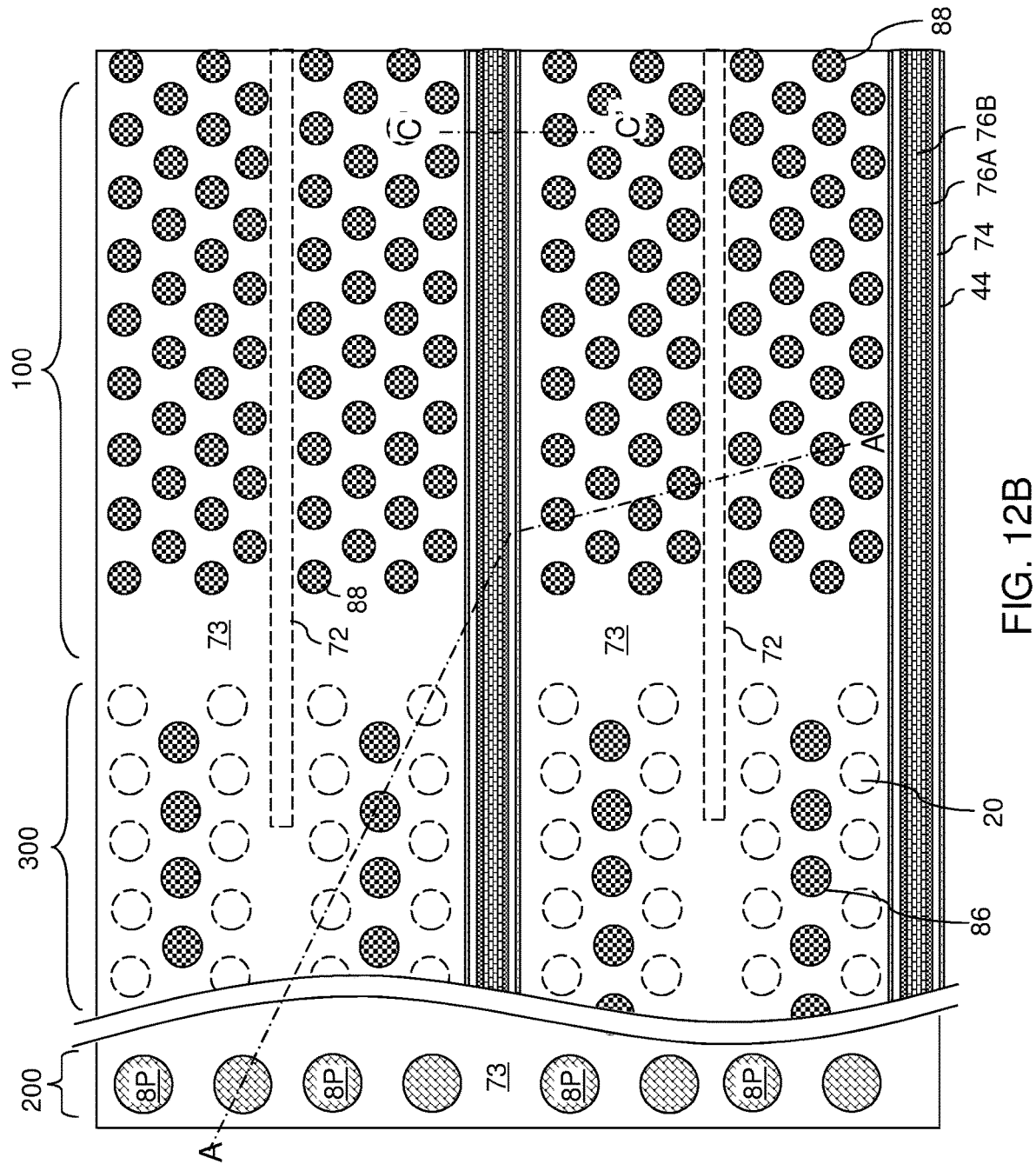
FIG. 12B is a top-down view of the exemplary structure of FIG. 12A. The vertical plane A-A' is the plane of the schematic vertical cross-sectional view of FIG. 12A.
Figure 12C:
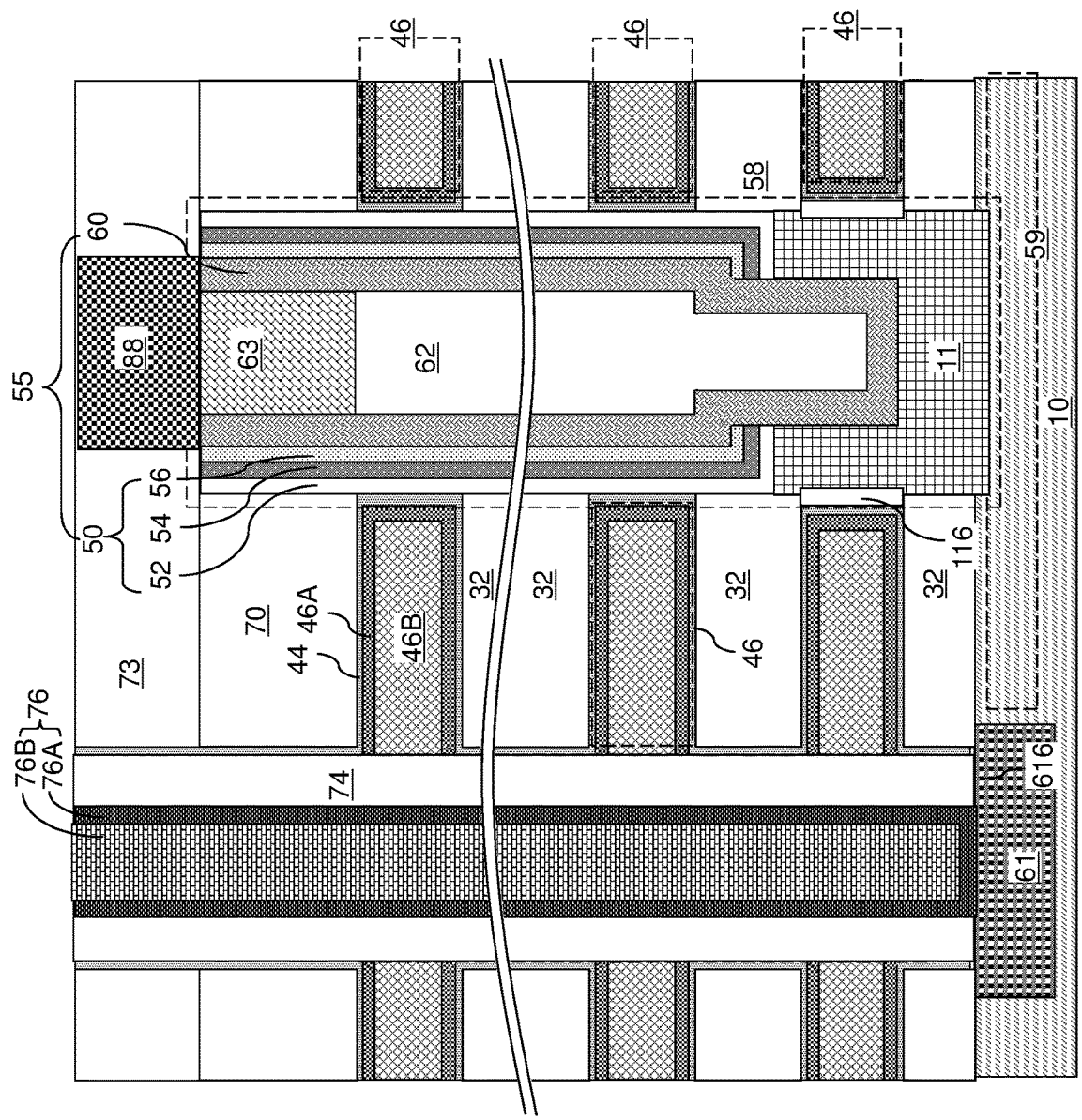
FIG. 12C is a schematic vertical cross-sectional view of the exemplary structure along the vertical plane C-C' of FIG. 12B.

Referring to FIGS. 12A-12C, additional contact via structures (88, 86, 8P) can be formed through the contact-level dielectric layer 73, and optionally through the stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the stepped dielectric material portion 65. Peripheral device contact via structures 8P can be formed through the stepped dielectric material portion 65 directly on respective nodes of the peripheral devices.

In one embodiment, a subset of the word line contact via structures 86 may directly contact sidewalls of a pad stack (32', 42') including a respective insulating pad 32' and a dielectric material pad 42'. In one embodiment, subset of the word line contact via structures 86 may vertically extend through a pad stack (32', 42') including a respective insulating pad 32' and a dielectric material pad 42'. In some embodiments, the word line contact via structures 86 vertically extend through the stepped dielectric material portion 65 and contact a sidewall of or extend through a respective pad stack (32', 42').

Figure 13:
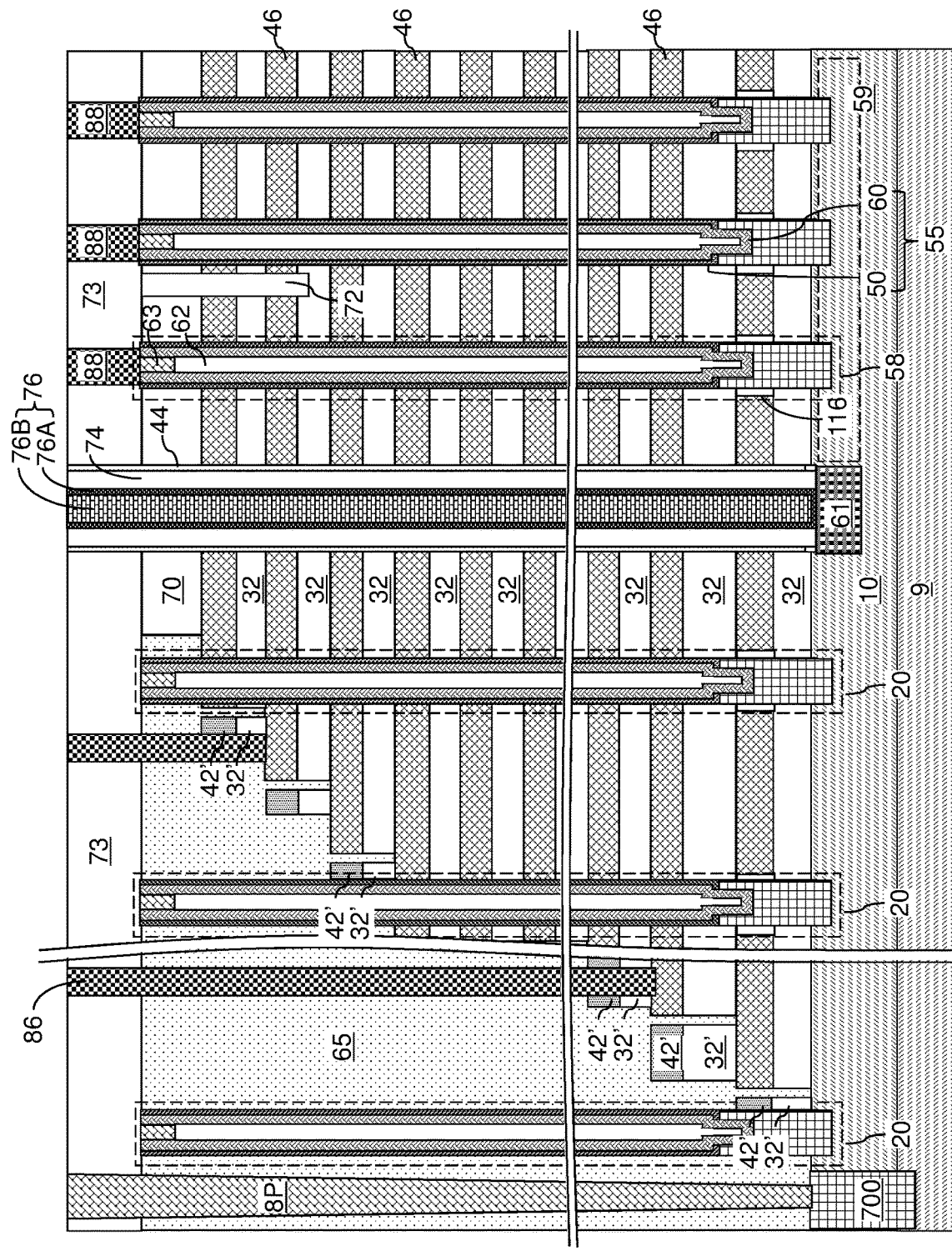
FIG. 13 is a schematic vertical cross-sectional view of a first alternative embodiment of the exemplary structure according to an embodiment of the present disclosure.

Referring to FIG. 13, a first alternative embodiment of the exemplary structure according to an embodiment of the present disclosure can be derived from the exemplary structure of FIGS. 12A-12C by omitting formation of the blocking dielectric layers 44. In this case, each electrically conductive layer 46 within an alternating stack (32, 46) contacts a bottom surface of a respective overlying insulating layer 32 of the insulating layers and contacts a top surface of a respective underlying insulating layer 32 of the insulating layers 32. The stepped surfaces comprise vertical sidewalls of the electrically conductive layers 46. In one embodiment, the stepped surfaces comprise horizontal surface segments of the electrically conductive layers 46.

Figure 14:
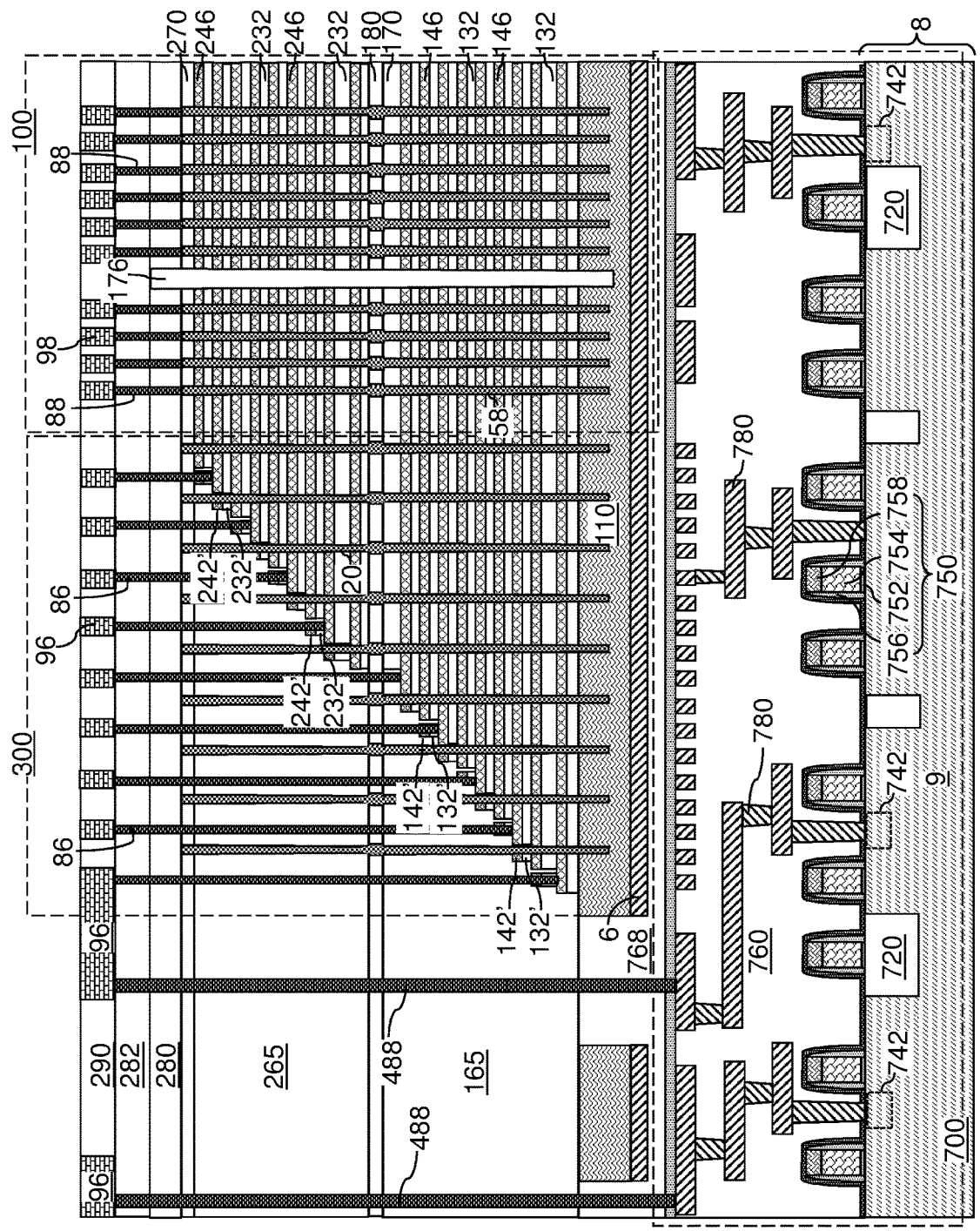
FIG. 14 is a schematic vertical cross-sectional view of a second alternative embodiment of the exemplary structure according to an embodiment of the present disclosure.

Referring to FIG. 14, a second alternative embodiment of the exemplary structure in which the peripheral devices 700 are located below the alternating stack, according to an embodiment of the present disclosure. The second exemplary structure employs peripheral semiconductor devices 700 (e.g., driver circuit/logic devices) formed on a top surface of a substrate 8 including a substrate semiconductor layer 9. The peripheral semiconductor devices 700 may comprise field effect transistors. Each of the field effect transistors may comprise a gate structure 750 and a pair of source/drain regions 742. Each gate structure 750 may comprise a gate dielectric 752, a gate electrode 754, a gate cap dielectric 758, and a dielectric gate spacer 756. The field effect transistors may be electrically isolated among one another by shallow trench isolation structures 720. Lower-level metal interconnect structures 780 embedded in lower-level dielectric material layers 760 may be provided over the field effect transistors and other semiconductor devices (not illustrated) to provide electrical connection thereamongst. The semiconductor devices 700 may comprise a peripheral circuit for a three-dimensional memory array that is located above the lower-level dielectric material layers 760.

A dielectric matrix layer 768 embedding a semiconductor material layer 110 and an optional metallic conductive layer 6 may be formed over the lower-level dielectric material layers 760. At least one alternating stack of insulating layers (132, 232) and electrically conductive layers (146, 246) can be formed over the semiconductor material layer 110. For example, a first-tier alternating stack of first insulating layers 146 and first electrically conductive layers 146 and a second-tier alternating stack of second insulating layers 232 and second electrically conductive layers 246 can be formed employing the processing steps described with reference to FIGS. 2A-12C. In this case, a first insulating cap layer 170 may be employed in lieu of the insulating cap layer 70 for the purpose of formation of the first stepped surfaces on the first-tier alternating stack (132, 146), and a second insulating cap layer 270 may be employed in lieu of the insulating cap layer 70 for the purpose of formation of the second stepped surfaces on the second-tier alternating stack (232, 346).

Pad stacks {(132', 142'), (232', 242')} can be formed over the first stepped surfaces of the first-tier alternating stack (132, 146) and over the second stepped surfaces of the second-tier alternating stack (232, 246), respectively. The pad stacks {(132', 142'), (232', 242')} may comprise first-tier pad stacks (132', 142') including a respective pair of a first insulating pad 132 and a first dielectric material pad 142', and second-tier pad stacks (232', 242') including a respective pair of a second insulating pad 232' and a second dielectric material pad 242'. A first stepped dielectric material portion 165 can be formed over the first stepped surfaces and the first-tier pad stacks (132', 142'). A second stepped dielectric material portion 265 can be formed over the second stepped surfaces and the second-tier pad stacks (232', 242').

Memory openings can be formed through the alternating stacks {(132, 146), (232, 246)}, and can be filled with memory opening fill structures 58, which may have the same set of components as the memory opening fill structures 58 described above. The semiconductor material layer 110 may comprise a horizontal source line (e.g., direct strap contact) which contacts a side of the lower portion of the semiconductor channel 60. Support openings can be formed through the alternating stacks {(132, 146), (232, 246)}, and can be filled with support pillar structures 20, which may have the same set of components as the memory opening fill structures 58 described above.

Backside trenches dividing laterally-neighboring pairs of backside trenches can be filled with dielectric backside trench fill structures 176. A first contact-level dielectric layer 280 and a second contact-level dielectric layer 282 can be formed over the alternating stacks {(132, 146), (232, 246)}. Drain contact via structures 88 can be formed through the contact-level dielectric layers (280, 282) to contact top surfaces of the drain regions in the memory opening fill structures 58. Word line contact via structures 86 can be formed through the stepped dielectric material portions (165, 265) on a respective one of the electrically conductive layers (146, 246). In some embodiments, the word line contact via structures 86 vertically extend through a stepped dielectric material portion (165 or 265) and contact a sidewall of a respective pad stack {(132', 142'), (232', 242')} among the pad stacks {(132', 142'), (232', 242')}.

Through-memory-level via structures 488 can be formed through the contact-level dielectric layers (280, 282) and through the stepped dielectric material portions (165, 265) to provide electrical connection to a subset of the lower-level metal interconnect structures 780. Upper-level metal interconnect structures (96, 98) embedded in upper-level dielectric material layers 290 can be subsequently formed. The upper-level dielectric material layers (96, 98) may comprise bit lines 98 electrically connected to a respective subset of the drain contact via structures 88, and word-line-connection lines 96 electrically connected to a respective one of the word line contact via structures 86.

Referring to all drawings and according to various embodiments of the present disclosure, a three-dimensional memory device comprises an alternating stack of insulating layers {32 or (132, 232)} and electrically conductive layers {46 or (146, 246)}, wherein stepped surfaces comprising vertical sidewalls of the insulating layers {32 or (132, 232)} are present in a staircase region 300; pad stacks {(32', 42'), (132', 142'), (232', 242')} located on the stepped surfaces, wherein each of the pad stacks {(32', 42'), (132', 142'), (232', 242')} comprises an insulating pad (32', 132', or 232') having a same material composition as the insulating layers (32, 132, 232), and a dielectric material pad (42', 142', or 242') having a different material composition than the insulating layers (32, 132, 232) and having sidewalls that are vertically coincident with sidewalls of the insulating pad (32', 132', or 232'); and memory stack structures 55 extending through the alternating stack {(32, 46) or (132, 146, 232, 246)}, wherein each of the memory stack structures 55 comprises a vertical stack of memory elements (such as portions of a memory material layer 54 located at levels of the electrically conductive layers) and a vertical semiconductor channel 60.

In one embodiment, each of the pad stacks is located on a respective horizontal surface of the stepped surfaces, the alternating stack is located over a substrate {(9, 10) or 8}, lateral extents of the electrically conductive layers decrease with a vertical distance from the substrate in the staircase region 300; and each of the insulating pads 32' has a same vertical thickness as a respective insulating layer 32 of the insulating layers that is vertically spaced from the substrate by a same vertical distance.

In one embodiment, each of the dielectric material pads 42' has a same or greater vertical thickness than a respective electrically conductive layer of the electrically conductive layers {46 or (146, 246)}, that is located at a same vertical level as the respective dielectric material pad.

In one embodiment, laterally neighboring pairs of vertical surfaces of the stepped surfaces are laterally spaced apart along a first horizontal direction hd1 by a uniform pitch; and the pad stacks {(32', 42'), (132', 142'), (232', 242')} comprise at least two pad stacks {(32', 42'), (132', 142'), (232', 242')} having different lateral dimensions along the first horizontal direction hd1.

In one embodiment, a stepped dielectric material portion {65 or (165, 265)} having a stepped bottom surface overlies a portion of the alternating stack in the staircase region 300, and contact via structures 86 vertically extend through the stepped dielectric material portion and contact a sidewall of or extend through a respective pad stack of the pad stacks. In one embodiment, the stepped dielectric material portion 65 comprises a plurality of downward-protruding portions 65P that contact surface segments of the stepped surfaces.

In one embodiment, the insulating layers (32, 132, 232) and the insulating pads (32', 132', 232') comprise silicon oxide, and the dielectric material pads (42', 142', 242') comprise silicon nitride.

In one embodiment, horizontal surfaces within the stepped surfaces have a same length along a first horizontal direction hd1 that is perpendicular to vertical surfaces of the stepped surfaces; and each of the pad stacks {(32', 42'), (132', 142'), (232', 242')} has a respective length along the first horizontal direction hd1 that is less than the same length of the horizontal surfaces within the stepped surfaces.

In one embodiment, each of the memory opening fill structures 58 comprises a memory film 50 including a tunneling dielectric layer (e.g., the dielectric material liner 56) that contacts the vertical semiconductor channel 60, a charge storage layer 54, portions of which comprise the vertical stack of memory elements located at levels of the electrically conductive layers, and a blocking dielectric layer 52 that surrounds the charge storage layer 54.

The various embodiments of the present disclosure can be employed to provide stepped surfaces having a uniform lateral terrace length along the word line direction that is perpendicular to the boundary between a memory array region 100 and a staircase region 300. The uniform lateral terrace length can be defined by a pattern within a two-dimensional array of insulating strips 70', and is independent of the local process variations in the trimming distance in any trimming step or process variations in multiple instances of a trimming step that is repeated over a terrace patterning process. Thus, dimensions of the horizontal steps of stepped surfaces can be tightly controlled to provide a higher process yield and a higher overall chip yield.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise.

Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers, wherein stepped surfaces comprising vertical sidewalls of the insulating layers are present in a staircase region;
    pad stacks located on the stepped surfaces, wherein each of the pad stacks comprises an insulating pad having a same material composition as the insulating layers, and a dielectric material pad having a different material composition than the insulating layers and having sidewalls that are vertically coincident with sidewalls of the insulating pad;
    memory stack structures extending through the alternating stack, wherein each of the memory stack structures comprises a vertical stack of memory elements and a vertical semiconductor channel; and
    a stepped dielectric material portion having a stepped bottom surface that overlies a portion of the alternating stack in the staircase region; and contact via structures vertically extending through the stepped dielectric material portion and contacting a sidewall of or extending through a respective pad stack of the pad stacks;
    wherein: the stepped dielectric material portion comprises a plurality of downward-protruding portions that contact surface segments of the stepped surfaces; and each of the plurality of downward-protruding portions is located between the respective pad stack and a vertically neighboring pair of a respective insulating layer and a respective electrically conductive layer within the alternating stack.

2. The three-dimensional memory device of claim 1, wherein:
    each of the pad stacks is located on a respective horizontal surface of the stepped surfaces;
    the alternating stack is located over a substrate;
    lateral extents of the electrically conductive layers decrease with a vertical distance from the substrate in the staircase region; and
    each of the insulating pads has a same vertical thickness as a respective insulating layer of the insulating layers that is vertically spaced from the substrate by a same vertical distance.

3. The three-dimensional memory device of claim 1, wherein each of the dielectric material pads has a same or greater vertical thickness than a respective electrically conductive layer of the electrically conductive layers that is located at a same vertical level as the respective dielectric material pad.

4. The three-dimensional memory device of claim 1, further comprising backside blocking dielectric layers located between each vertically neighboring pair of an insulating layer and an electrically conductive layer within the alternating stack, wherein:
    each electrically conductive layer within the alternating stack is embedded within a respective backside blocking dielectric layer of the backside blocking dielectric layers; and
    the stepped surfaces comprise vertical sidewalls of the backside blocking dielectric layers.

5. The three-dimensional memory device of claim 4, wherein the stepped surfaces comprise horizontal surface segments of the insulating layers or horizontal surface segments of the backside blocking dielectric layers.

6. The three-dimensional memory device of claim 1, wherein:
    each electrically conductive layer within the alternating stack contacts a bottom surface of a respective overlying insulating layer among the insulating layers and contacts a top surface of a respective underlying insulating layer among the insulating layers; and
    the stepped surfaces comprise vertical sidewalls of the electrically conductive layers.

7. The three-dimensional memory device of claim 6, wherein the stepped surfaces comprise horizontal surface segments of the insulating layers or horizontal surface segments of the electrically conductive layers.

8. The three-dimensional memory device of claim 1, wherein:
    laterally neighboring pairs of vertical surfaces of the stepped surfaces are laterally spaced apart along a first horizontal direction by a uniform pitch; and
    the pad stacks comprise at least two pad stacks having different lateral dimensions along the first horizontal direction.

9. The three-dimensional memory device of claim 1, wherein:
    the insulating layers and the insulating pads comprise silicon oxide; and
    the dielectric material pads comprise silicon nitride.

10. The three-dimensional memory device of claim 1, wherein:
    horizontal surfaces within the stepped surfaces have a same length along a first horizontal direction that is perpendicular to vertical surfaces of the stepped surfaces; and
    each of the pad stacks has a respective length along the first horizontal direction that is less than the same length of the horizontal surfaces within the stepped surfaces.

11. The three-dimensional memory device of claim 1, wherein each of the memory opening fill structures comprises a memory film including a tunneling dielectric layer that contacts the vertical semiconductor channel, a charge storage layer portions of which comprise the vertical stack of memory elements located at levels of the electrically conductive layers, and a blocking dielectric layer that surrounds the charge storage layer.

12. A method of forming a three-dimensional memory device, comprising:
    forming an alternating stack of insulating layers and dielectric sacrificial material layers over a substrate;
    forming insulating strips over the alternating stack, wherein the insulating strips are laterally spaced apart along a first horizontal direction and laterally extend along a second horizontal direction that is perpendicular to the first horizontal direction;
    forming a trimmable mask material layer over the insulating strips such that an edge of the trimmable mask material layer that laterally extends along a second horizontal direction that is perpendicular to the first horizontal direction overlies one of the insulating strips;
    performing multiple iterations of a unit pattern transfer sequence, wherein the unit pattern transfer sequence comprises a first processing step in which unmasked portions of the alternating stack and the insulating strips are etched anisotropically by a respective anisotropic etch process, and a second processing step in which the trimmable mask layer is trimmed by a respective trimming distance, whereby stepped surfaces comprising vertical sidewalls of the insulating layers, vertical sidewalls of the dielectric sacrificial material layers, and horizontal surfaces of the insulating layers or the dielectric sacrificial material layers are formed a staircase region in which lateral extents of the dielectric sacrificial material layers decrease with a vertical distance from the substrate;

forming memory stack structures through the alternating stack, wherein each of the memory stack structures comprises a vertical stack of memory elements and a vertical semiconductor channel; and replacing the dielectric sacrificial material layers with electrically conductive layer;

wherein patterned portions of the alternating stack that are formed during the anisotropic etch processes comprise pad stacks located on the stepped surfaces, wherein each of the pad stacks comprises an insulating pad having a same material composition as the insulating layers and a dielectric material pad having a same material composition as the dielectric sacrificial material layers.

13. The method of claim 12, wherein:

the insulating strips are laterally spaced apart along the first horizontal direction with a uniform pitch;

each of the trimming distances is in a range from 90% of the uniform pitch and 110% of the uniform pitch; and each neighboring pair of insulating strips of the insulating strips is laterally spaced apart from each other along the first horizontal direction by a uniform gap width that is in a range from 2% to 30% of the uniform pitch.

14. The method of claim 12, further comprising forming a stepped dielectric material portion over the stepped surfaces in the staircase region.

15. The method of claim 12, wherein:

each pad stack that is formed during anisotropic etch processes other than a last anisotropic process within the multiple iterations of the unit pattern transfer sequence is etched and removed during a subsequent anisotropic etch process; and the subsequent anisotropic etch process transfers patterns of pre-existing pad stacks into a respective underlying insulating layer and a respective underlying dielectric sacrificial material layer within the alternating stack prior to removal of the pre-existing pad stacks.

16. The method of claim 12, wherein the replacing the dielectric sacrificial material layers with the electrically conductive layers comprises:

forming backside trenches through the alternating stack, such that the backside trenches are laterally offset from the pad stacks along the second horizontal direction;

selectively etching dielectric sacrificial material layers through the backside trenches to form backside recesses without etching the dielectric material pads of the pad stacks; and forming the electrically conductive layers in the backside recesses through the backside trenches.

17. The method of claim 12, wherein:

the dielectric sacrificial material layers comprise silicon nitride; and the insulating layers comprise silicon oxide.

* * * * *